(12) United States Patent
Wu et al.

(10) Patent No.: US 10,892,257 B2
(45) Date of Patent: Jan. 12, 2021

(54) FOLDABLE DISPLAY DEVICE

(71) Applicant: InnoLux Corporation, Miao-Li County (TW)

(72) Inventors: Yuan-Lin Wu, Miao-Li County (TW); Kuan-Feng Lee, Miao-Li County (TW); Tsung-Han Tsai, Miao-Li County (TW); Jia-Yuan Chen, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/252,732

(22) Filed: Jan. 21, 2019

(65) Prior Publication Data
US 2020/0235084 A1  Jul. 23, 2020

(51) Int. Cl.
*H01L 25/16* (2006.01)
*H01L 27/12* (2006.01)
*H01L 33/54* (2010.01)
*H01L 33/62* (2010.01)
*H01L 33/48* (2010.01)
*H01L 33/46* (2010.01)
*H01L 33/50* (2010.01)
*H01L 23/00* (2006.01)
*H01L 25/075* (2006.01)
(Continued)

(52) U.S. Cl.
CPC ........ *H01L 25/167* (2013.01); *H01L 23/5387* (2013.01); *H01L 24/32* (2013.01); *H01L 24/83* (2013.01); *H01L 25/0753* (2013.01); *H01L 27/1218* (2013.01); *H01L 33/46* (2013.01); *H01L 33/48* (2013.01); *H01L 33/505* (2013.01); *H01L 33/54* (2013.01); *H01L 33/62* (2013.01); *H01L 33/06* (2013.01); *H01L 33/56* (2013.01); *H01L 2224/32145* (2013.01); *H01L 2224/83201* (2013.01); *H01L 2924/3512* (2013.01); *H01L 2933/0066* (2013.01)

(58) Field of Classification Search
CPC ......... H01L 23/5387; H01L 2351/0097; H01L 2251/5338; H01L 25/167; H01L 27/1218; H01L 33/54; H01L 33/48; H01L 25/0753; H01L 33/06; G09G 2380/02
See application file for complete search history.

(56) References Cited

U.S. PATENT DOCUMENTS 8,987,765 B2    3/2015  Bibl
2013/0169515 A1*  7/2013  Prushinskiy ............ H01L 51/56
                                                    345/55

(Continued)

*Primary Examiner* — Tucker J Wright
(74) *Attorney, Agent, or Firm* — Winston Hsu

(57) ABSTRACT

A foldable display device having a first display region, a second display region, and a foldable display region connecting the first display region and the second display region includes a flexible substrate, a plurality of first light emitting units disposed on the flexible substrate in the first display region, a plurality of second light emitting units disposed on the flexible substrate in the foldable display region, a first protector protecting at least one of the first light emitting units, and a second protector protecting at least one of the second light emitting units. A first ratio of a thickness of the first protector to a thickness of the flexible substrate in the first display region is less than a second ratio of a thickness of the second protector to a thickness of the flexible substrate in the foldable display region.

20 Claims, 19 Drawing Sheets

(51) Int. Cl.
  *H01L 23/538*   (2006.01)
  *H01L 33/06*    (2010.01)
  *H01L 33/56*    (2010.01)

(56) References Cited

U.S. PATENT DOCUMENTS

2016/0315068 A1    10/2016    Lee
2017/0064291 A1     3/2017    Do
2017/0269749 A1     9/2017    Bok

* cited by examiner

FOLDABLE DISPLAY DEVICE

BACKGROUND OF THE DISCLOSURE

1. Field of the Disclosure

The present disclosure is related to a display device, and more particularly, to a foldable display device.

2. Description of the Prior Art

In recent years, foldable electronic device has become one of next generation technologies. The foldable electronic device offers portability when in a folded state and expands into a relatively large sized display when in an unfolded state, and accordingly, the foldable electronic device may have various applications in electronic displays, such as used in televisions, monitors, mobile computing devices, such as smartphones, tablet computers, mobile personal computers (PCs), and electronic book readers, and wearable devices, such as smart watches. In addition, light emitting elements have been applied to display devices for providing light source or displaying images. However, the light emitting elements may much easily have defects when they are disposed in foldable parts of the foldable display device. Therefore, it is an important issue for the manufacturers to improve the yield of the foldable display device with light emitting elements.

SUMMARY OF THE DISCLOSURE

One of the objectives of the present disclosure is to provide a foldable display device and related electronic device, wherein the foldable display device includes light emitting units for display images. Another objective of the present disclosure is to provide an electronic device including a foldable region connected to a flat region.

In one embodiment, the foldable display device includes a first display region, a second display region, and a foldable display region connecting the first display region and the second display region, and the foldable display device comprises a flexible substrate, a plurality of first light emitting units disposed on the flexible substrate in the first display region, a plurality of second light emitting units disposed on the flexible substrate in the foldable display region, a first protector protecting at least one of the first light emitting units, and a second protector protecting at least one of the second light emitting units. A ratio of a thickness of the first protector to a thickness of the flexible substrate in the first display region is defined as a first ratio, a ratio of a thickness of the second protector to a thickness of the flexible substrate in the foldable display region is defined as a second ratio, and the second ratio is greater than the first ratio.

In one embodiment, a foldable electronic device including a first region, a second region, and a foldable region connecting the first region and the second region is disclosed. The foldable electronic device comprises a flexible substrate, a plurality of first electronic units disposed on the flexible substrate in the first region, a plurality of second electronic units disposed on the flexible substrate in the foldable region, a first protector protecting at least one of the first electronic units, and a second protector protecting at least one of the second electronic units. A ratio of a thickness of the first protector to a thickness of the flexible substrate in the first region is defined as a first ratio, a ratio of a thickness of the second protector to a thickness of the flexible substrate in the foldable region is defined as a second ratio, and the second ratio is greater than the first ratio.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the display device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ".

It will be understood that when an element or layer is referred to as being "on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented.

It should be noted that the technical features in different embodiments described in the following can be replaced, recombined, or mixed with one another to constitute another embodiment without departing from the spirit of the present disclosure.

Figure 1:
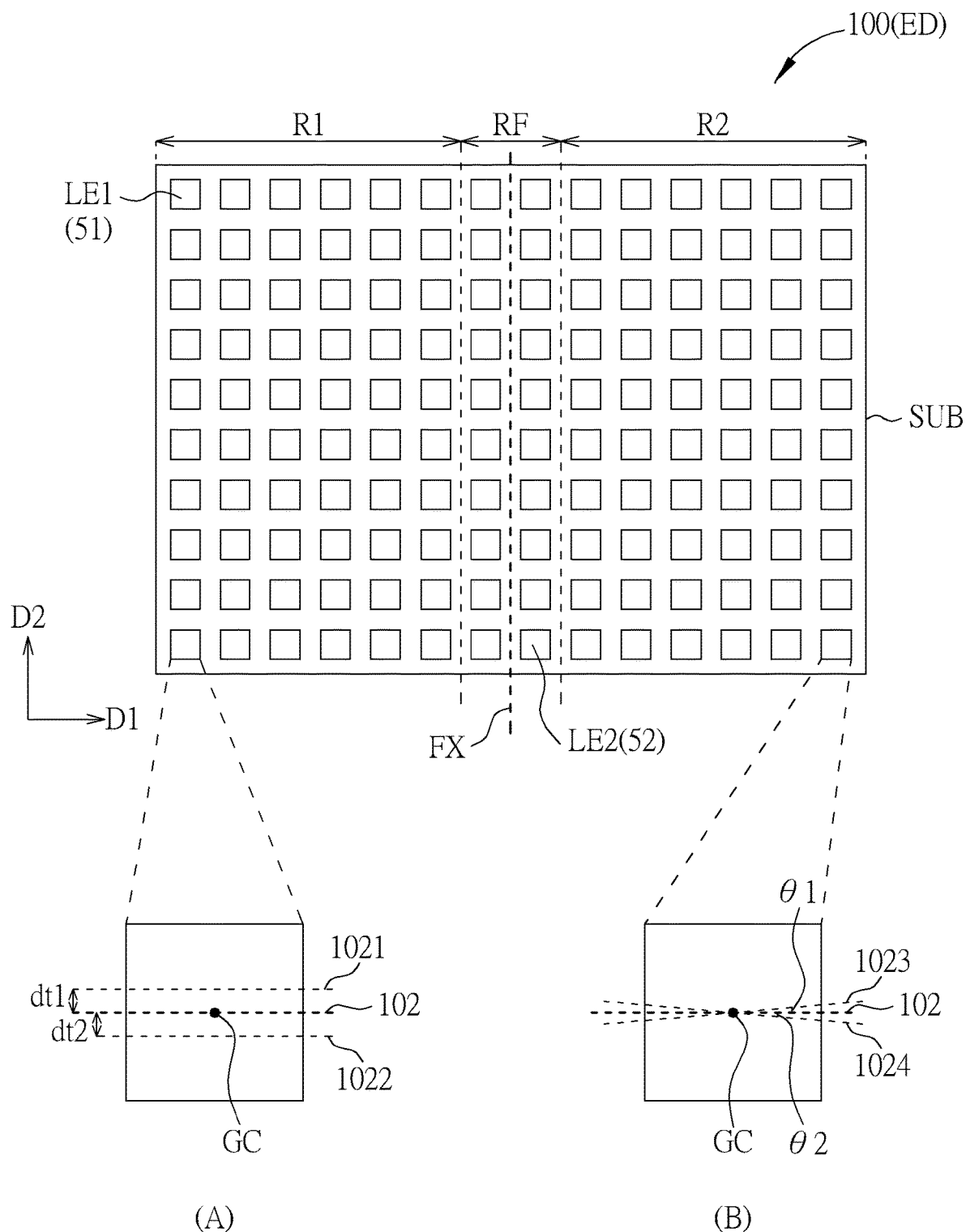
FIG. 1 is a schematic diagram of a top view of an electronic device or a foldable display device according to a first embodiment of the present disclosure.
Figure 2:
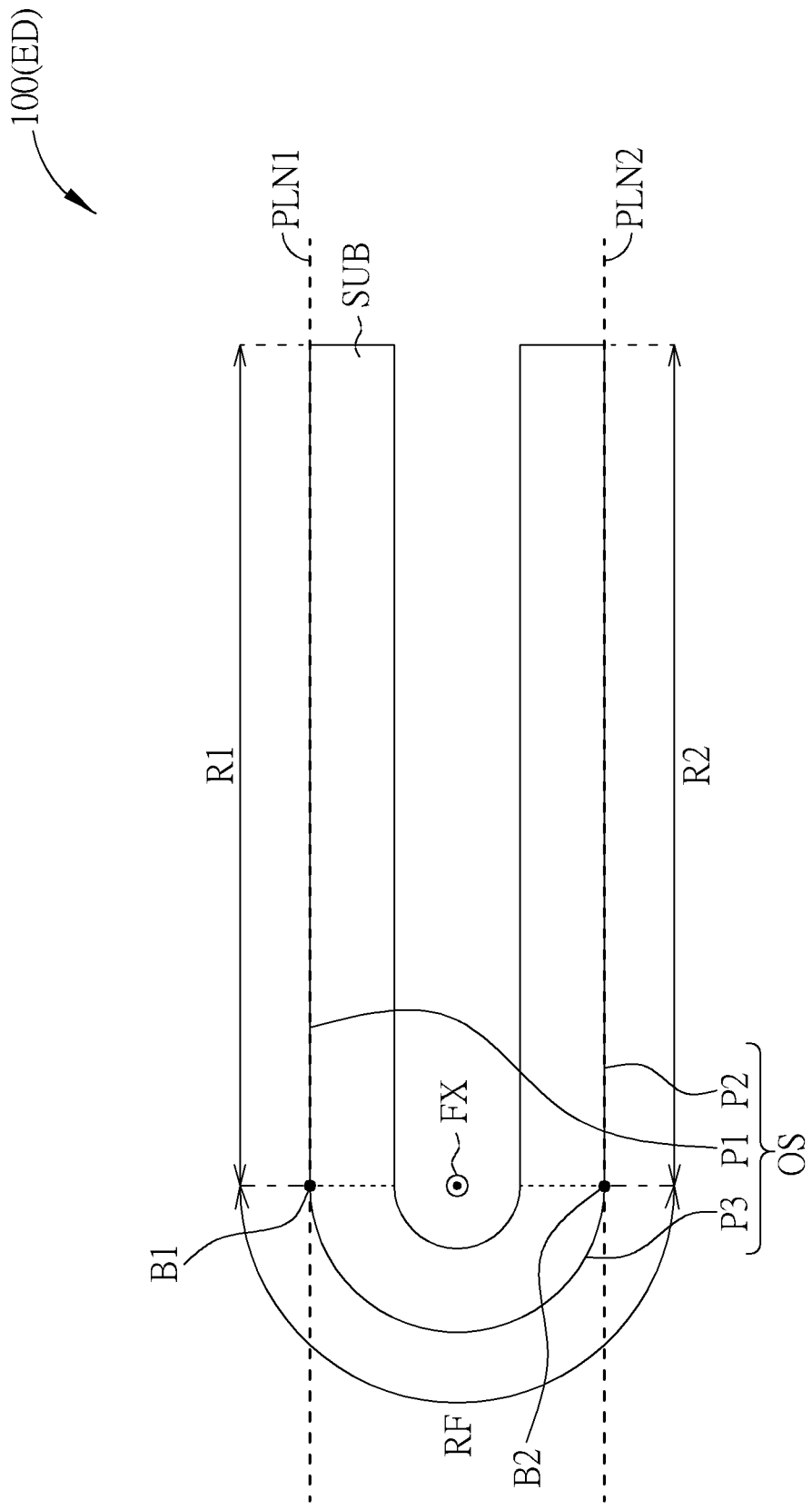
FIG. 2 is a schematic diagram of a sectional view of the electronic device or foldable display device shown in FIG. 1.
Figure 3:
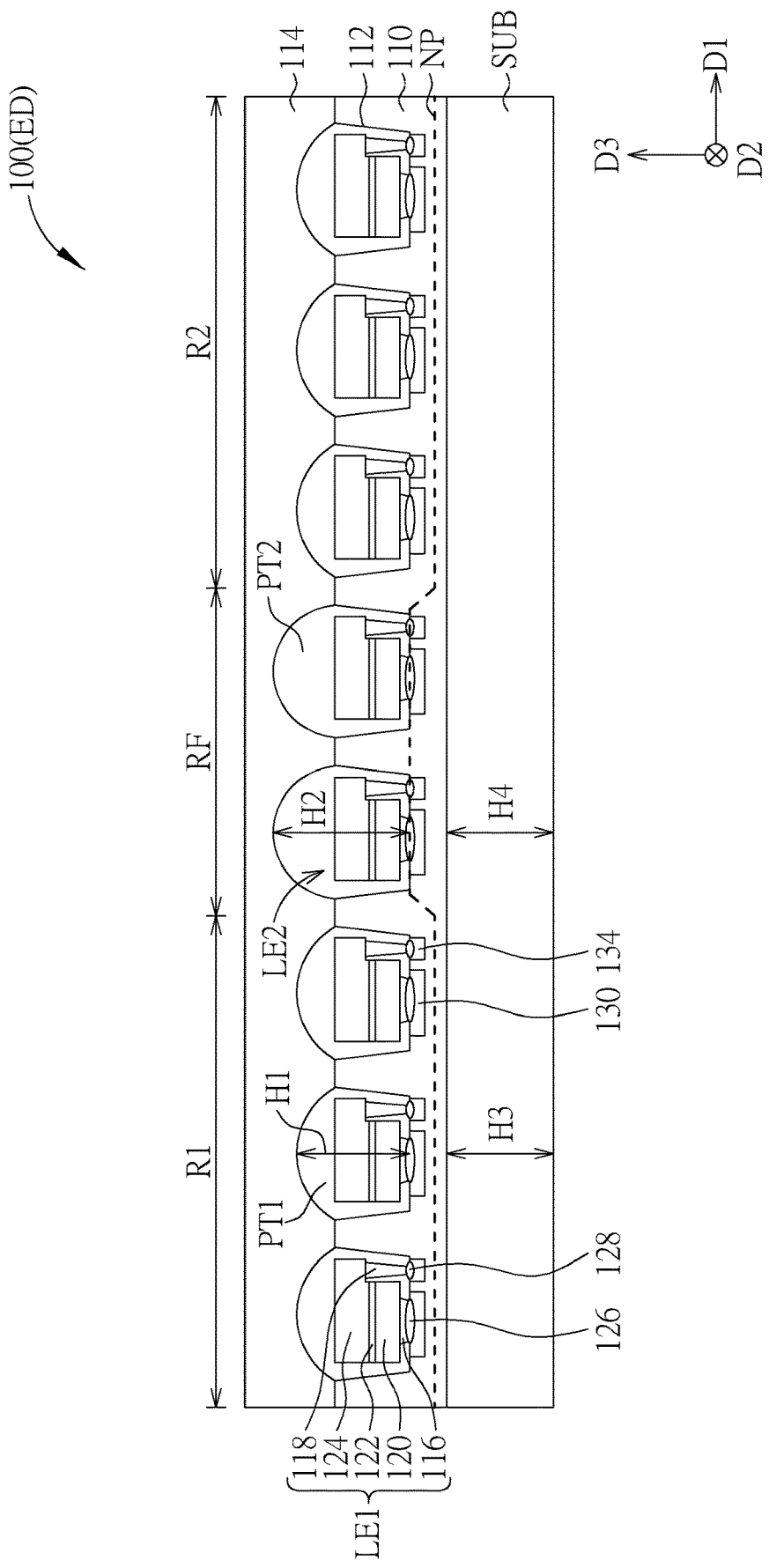
FIG. 3 is a schematic diagram of a sectional view with more details of the electronic device or foldable display device shown in FIG. 1

Referring to FIG. 1 to FIG. 3, FIG. 1 is a schematic diagram of a top view of an electronic device or a foldable display device according to a first embodiment of the present disclosure, FIG. 2 is a schematic diagram of a sectional view of the electronic device or foldable display device shown in FIG. 1, and FIG. 3 is a schematic diagram of a sectional view with more details of the electronic device or foldable display device shown in FIG. 1, wherein the electronic device shown in FIG. 2 is in a folding state. As shown in FIG. 1 and FIG. 2, the electronic device ED of the present disclosure can be a foldable electronic device, which can be folded along a folding axis FX between 180° to −180°. For example, the foldable electronic device ED in FIG. 2 shows the inwardly folding state and the folding angle is 180°. The foldable electronic device ED includes a first region R1, a second region R2, and a foldable region RF connecting the first region R1 and the second region R2. In some embodiments, the first region R1 and the second region R2 can be flat, or can be flatter than the foldable region RF. The foldable electronic device ED in the foldable region RF is capable of being curved, bent, and/or folded. In some embodiments, the foldable electronic device ED can include more than one foldable region RF. Referring to FIG. 1 and FIG. 2, the foldable electronic device ED of the present disclosure can include a flexible substrate SUB, a plurality of first electronic units 51 disposed on the flexible substrate SUB in the first region R1 and/or in the second region R2, and a plurality of second electronic units 52 disposed on the flexible substrate SUB in the foldable region RF. In some embodiments, the first electronic units 51 and the second electronic units 52 can have display function. For example, the first electronic units 51 can be a plurality of first light emitting units LE1 disposed in the first region R1 and/or in the second region R2, and the second electronic units 52 can be a plurality of second light emitting units LE2 disposed in the foldable region RF. In such situation, the first region R1, the second region R2, and the foldable region RF may have display function, thus they could also be called as first display region R1, second display region R2, and foldable display region RF respectively in some embodiments. The light emitting units can be arranged in a matrix, for example, arranged in a plurality of rows in a direction D1 and a plurality of columns in a direction D2. The direction D1 and direction D2 can be different, for example, perpendicular to each other. However, the arrangement of the light emitting units is not limited.

According to some embodiments, the first electronic units 51 and the second electronic units 52 can have no display function; for example, can be antenna units, for example liquid crystal antenna units. Electromagnetic wave can be emitted from or received by the antenna units.

According to some embodiments, the foldable electronic device ED may be a foldable display device 100. The foldable electronic device ED has an outer surface OS, which includes a first surface part P1 defining the first display region R1, a second surface part P2 defining the second display region R2, and a third surface part P3 defining the foldable display region RF. When the foldable electronic device ED is expanded to an unfolded state, the first surface part P1, the second surface part P2 and the third surface part P3 are in level with the same plane. When the foldable electronic device ED is folded to a folded state as shown in FIG. 2, the first surface part P1 is flat and in level with a plane PLN1, the second surface part P2 is flat and in level with another plane PLN2, and the third surface part P3 is bent and not in level with the above-mentioned planes. Accordingly, when the foldable electronic device ED is at the folded state, the third surface part P3 can be defined between the plane PLN1 and the plane PLN2. In detail, a first boundary B1 is defined at a position departing away from the first surface part P1, and a second boundary B2 is defined at a position departing away from the second surface part P2. In other words, the foldable region RF can be defined by a region between the first boundary B1 and the second boundary B2.

For easy explanation, some examples are taken when the foldable electronic device ED is the foldable display device 100 in the following embodiments. Referring to FIG. 3, the foldable display device 100 include a plurality of first light emitting units LE1 disposed on the flexible substrate SUB in the first display region R1 and in the second display region R2, a plurality of second light emitting units LE2 disposed on the flexible substrate SUB in the foldable display region RF, a first protector PT1 protecting at least one of the first light emitting units LE1, and a second protector PT2 protecting at least one of the second light emitting units LE2. A circuit layer 110 may be further disposed on the flexible substrate SUB. The circuit layer 110 can include conductive lines and/or driving elements (for example, transistors), but is shown as a single layer in FIG. 3 for easy illustration. Detailed structure of the circuit layer 110 will be described in the following embodiments. The circuit layer 110 can include a plurality of cavities 112 for disposing the first light emitting units LE1 and second light emitting units LE2. The first protector PT1 may cover and fill the cavities 112 in which the first light emitting units LE1 are disposed. The second protector PT2 may cover and fill the cavities 112 in which the second light emitting units LE2 are disposed. A cover layer 114 may be further disposed on the first protector PT1 and the second protector PT2.

In some embodiments, the first and second light emitting units LE1, LE2 can be organic light emitting diodes (OLED), inorganic LEDs, or quantum dot LEDs (QLED). Inorganic LED can be mini-LED or micro-LED. In some embodiments, the size of a mini-LED can be in a range from 100 μm to 300 μm. In some embodiment, the size of a micro-LED can be in a range from 1 μm to 100 μm. The first light emitting units LE1 and the second light emitting units LE2 may be flip chip-type or vertical type. Taking the first light emitting unit LE1 as an example, it may include a first electrode 116, a second electrode 118, a first semiconductor layer 120, a light emitting layer 122, and a second semiconductor layer 124. The light emitting layer 122 may be, but not limited to, a multiple quantum well (MQW) layer for example. The first light emitting unit LE1 is electrically connected to the circuit layer 110 through the first bonding material 126, 128. In detail, the circuit layer 110 can include a plurality of bonding pads 130 and a plurality of bonding pads 134. Taking one first light emitting unit LE1 for an example, the first electrode 116 of the first light emitting unit LE1 can be electrically connected to one of the bonding pads 130 through the first bonding material 126, and the second electrode 118 of the first light emitting unit LE1 can be electrically connected to the bonding pad 134 through the first bonding material 128. The connection between the second light emitting units LE2 and the circuit layer 110 may be similar to the above-mentioned connection between the first light emitting units LE1 and the circuit layer 110, thus no redundant details will be described. When the circuit layer 110 includes driving elements for driving light emitting units, the foldable display device 100 is an active-type display device. The foldable display device 100 may be a passive-type display device, and the first light emitting units LE1 and the second light emitting units LE2 may be not directly connected to driving elements.

In some embodiments, the first light emitting units LE1 in the first display region R1 and the second display region R2 are covered by the first protector PT1, and the second light emitting units LE2 in the foldable display region RF are covered by the second protector PT2, as shown in FIG. 3, but not limited thereto. The first protector PT1 has a thickness H1, and the second protector PT2 has a thickness H2. Referring to FIG. 1 and FIG. 3 together, the definition of the thicknesses of the protectors may refer to the enlarged views of the first light emitting units LE1 in the bottom part of FIG. 1. For example, the method of determining the thickness H1 of the first protector PT1 may include the following steps: (1) selecting a first light emitting unit LE1; (2) determining the geometric center GC of the selected first light emitting unit LE1; (3) forming a sectional cutting (shown as a cross line 102) that passes through the geometric center GC to obtain a cross-section profile; and (4) along the cross-section profile, measuring the maximum thickness of the first protector PT1 from the bottom surface to the top surface of the first protector PT1 to obtain the thickness of the first protector PT1. In some embodiments, the steps (1) to (4) may be performed for total five times to measure the thicknesses of five different selected first light emitting units LE1 to obtain an average value, so as to determine the above-mentioned thickness H1 of the first protector PT1. In addition, a thickness H3 of the flexible substrate SUB in the first display region R1 that corresponds to the thickness H1 of the first protector PT1 may also be determined in the above-mentioned cross-section profile. For example, the sectional cutting (the cross line 102) can be perpendicular to the folding axis FX. A little shift or deviation of the sectional cutting may be accepted. For example, the tolerance difference of the sectional cutting may be less than ±5 μm, represented by the tolerance difference dt1 and dt2 between the tolerance cross lines 1021 and 1022 and the accurate cross line 102 as shown in the part (A) of FIG. 1. In another example, the tolerance rotation angle of the sectional cutting may be less than 3°-5°, represented by the tolerance rotation angles θ1 and θ2 of the tolerance cross lines 1023 and 1024 as shown in the part (B) of FIG. 1. The determination of the thickness H2 of the second protector PT2 and the corresponding thickness H4 of the flexible substrate SUB in the foldable display region RF may be similar to the determining method of the thickness H1 and thickness H3, and redundant details will not be repeated.

A ratio of the thickness H1 of the first protector PT1 to a thickness H3 of the flexible substrate SUB in the first display region R1 is defined as a first ratio Ra1 (i.e. Ra1=H1/H3), and a ratio of the thickness H2 of the second protector PT2 to a thickness H4 of the flexible substrate SUB in the foldable display region RF is defined as a second ratio Ra2 (i.e. Ra2=H2/H4). As shown in FIG. 3, by designing the second ratio Ra2 being different from the first ratio Ra1, the neutral plane NP of the foldable display device 100 can be adjusted. For example, in some embodiments, it is designed that the second ratio is greater than the first ratio (Ra2>Ra1), such that the neutral plane NP in the foldable display region RF may be more close to the interface of the second light emitting units LE2 and the bonding pads 130, 134. Thus, when the foldable display device 100 is in a folded state, a better adhesion performance or reliability for the second light emitting units LE2 can be obtained. The above-mentioned neutral plane NP means the plane composed of the minimum-stress points along a direction D3 of the foldable display device 100, wherein the direction D3 is perpendicular to the surface of the flexible substrate SUB.

In some embodiments, the thickness H2 of the second protector PT2 may be greater than the thickness H1 of the first protector PT1, and the thickness H3 of the flexible substrate SUB corresponding to the first display region R1 or second display region R2 may be substantially equal to the thickness H4 of the flexible substrate SUB corresponding to the foldable display region RF (i.e. H2>H1 and H4=H3), such that the second ratio Ra2 can be greater than the first ratio Ra1, as shown in FIG. 3. In some embodiments, the thickness H2 of the second protector PT2 may be greater than or equal to the thickness H1 of the first protector PT1 while the thickness H3 of the flexible substrate SUB may be greater than the thickness H4 of the flexible substrate SUB, such that the second ratio Ra2 may be still greater than the first ratio Ra1 (i.e. H2≥H1 and H4<H3). For example, the thickness H2 may be in a range from about 5 μm to about 15 μm; the thickness H4 may be in a range from about 10 μm to about 100 μm; the thickness H1 may be in a range from about 3 μm to about 10 μm; and the thickness H3 may be in a range from about 10 μm to about 120 μm, but not limited thereto.

In some embodiments, the first ratio Ra1 and the second ratio Ra2 may meet at least one of the following equations:

$0.1 \leq Ra2 \leq 1.5;$ $0.02 \leq Ra1 < 0.1;$ and $0.005 \leq Ra2-Ra1 \leq 1.5.$ If the value of the first ratio Ra1 or the second ratio Ra2 is too great, the flexible substrate SUB may lack enough supporting ability to the light emitting unit; and if the value of the first ratio Ra1 or the second ratio Ra2 is too small, the first protector PT1 or the second protector PT2 cannot provide enough protection to the corresponding light emitting unit when the foldable display device 100 is folded. Therefore, according to some embodiments, the first ratio Ra1 and the second ratio Ra2 can be designed in suitable values, in order to prevent the probability of damage or falling down of the light emitting units in the folding state, influencing on the yield of the foldable display device 100. Accordingly, when the first ratio Ra1 and the second ratio Ra2 are maintained in suitable ranges, such as the values listed above, the reliability of the foldable display device 100 may be improved. The reliability, cracking probability, or damage can be determined according to a folding test. The foldable display device 100 can be folded, for example, for 100000 times (without limitation to the present disclosure) and the sample can be checked by an optical microscope (OM). The design of relative value that the first ratio Ra1 is less than the second ratio Ra2 may be applied to any other embodiments and variant embodiments of the present disclosure, which may not be repeated in detail.

In some embodiments, the first protector PT1 and the second protector PT2 can be of the same material. Or, in variant embodiments, the material of the first protector PT1 may be non-identical to the material of the second protector PT2. For example, the Young's modulus of the second protector PT2 may be less than the Young's modulus of the first protector PT1. The first protector PT1 may have better degree of rigidity and/or resilience. The second protector PT2 with the less Young's modulus may provide better elongation property so as to reduce cracking probability of the second protector PT2 when the foldable display device 100 is folded. The first protector PT1 can be an organic material, and the organic material of the first protector PT1 may include at least one selected from an acryl-based resin and an epoxy based resin. The Young's modulus of the first protector PT1 may be in a range of about 2 to about 20 Gpa. The second protector PT2 may comprise organic material that includes silicon-based resin. The Young's modulus of the second protector PT2 of the organic material may be in a range of about 0.001 to about 0.05 Gpa.

The electronic device and foldable display device of the present disclosure are not limited by the aforementioned embodiment, and may have other different embodiments and variant embodiments. To simplify the description, the identical components in each of the following embodiments are marked with identical symbols. For making it easier to compare the difference between the embodiments, the following description will detail the dissimilarities among different embodiments and the identical features will not be redundantly described.

Figure 4:
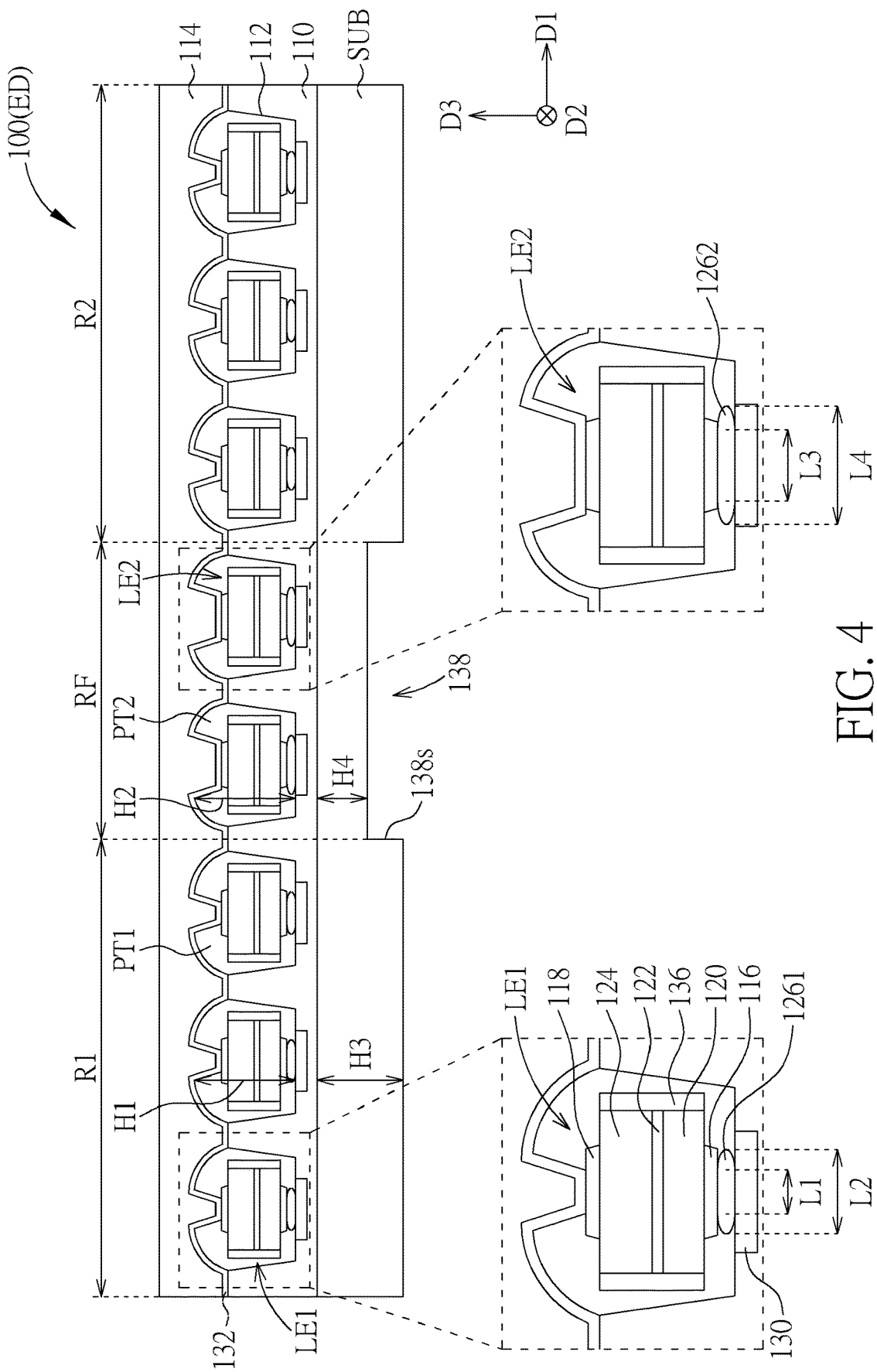
FIG. 4 is a schematic sectional-view of an electronic device or a foldable display device according to a second embodiment of the present disclosure.

Referring to FIG. 4, FIG. 4 is a schematic sectional-view of an electronic device or a foldable display device according to a second embodiment of the present disclosure. In the second embodiment, the first light emitting units LE1 and the second light emitting units LE2 may be vertical-type LEDs for example. Similarly, the first light emitting units LE1 and the second light emitting units LE2 may include mini-LEDs and/or micro-LEDs. The second electrode 118 of one of the first light emitting units LE1 or the second light emitting units LE2 may be electrically connected to a common electrode 132 that laterally extends over the first light emitting units LE1, the second light emitting units LE2, and the circuit layer 110. In other words, the common electrode(s) 132 electrically connected to the second electrodes 118 of different first light emitting units LE1 and second light emitting units LE2 may be connected to each other. In some embodiments, the thickness H1 of the first protector PT1 covering the first light emitting units LE1 may be substantially equal to the thickness H2 of the second protector PT2 covering the second light emitting units LE2, but the thickness H4 of the flexible substrate SUB in the foldable display region RF is smaller than the thickness H3 of the flexible substrate SUB in the first display region R1 or in the second display region R2. In detail, the flexible substrate SUB may have at least one recess 138 in the foldable display region RF, thus the thickness H4 corresponding to the recess 138 is thinner. The sidewall 138s of the recess 138 may be approximately perpendicular to the surface of the flexible substrate SUB or parallel to the direction D3 in some embodiments, but not limited thereto. In such design of the recess 138 of the flexible substrate SUB, the second ratio Ra2 of the thickness H2 to the thickness H4 may be greater than the first ratio Ra1 of the thickness H1 to the thickness H3.

In another aspect, one of the first light emitting units LE1 is electrically connected to the circuit layer 110 through a first bonding material 1261, one of the second light emitting units LE2 is electrically connected to the circuit layer 110 through a second bonding material 1262, and the first bonding material 1261 and the second bonding material 1262 may have different areas. For example, the area of the first bonding material 1261 may be smaller than the area of the second bonding material 1262, but not limited thereto. As shown in FIG. 4, the first bonding material 1261 may have an area L1 representing the contact area of the first bonding material 1261 and the first electrode 116 of the first light emitting unit LE1 and may have a maximum area L2 corresponding to a projection area of the first bonding material 1261 on the surface of the flexible substrate SUB, and the second bonding material 1262 may have an area L3 representing the contact area of the second bonding material 1261 and the first electrode 116 of the second light emitting unit LE2 and may have a maximum area L4 corresponding to a projection area of the second bonding material 1262 on the surface of the flexible substrate SUB. The area L3 is greater than the area L1, and the area L4 is greater than the area L2. In such design, the quantity of the second bonding material 1262 corresponding to one of the second light emitting units LE2 may be greater than the quantity of the first bonding material 1261 corresponding to one of the first light emitting units LE1, and therefore the bonding area of the second bonding material 1262 can be larger than the bonding area of the first bonding material 1261. The larger bonding area of the second bonding material 1262 may provide a firmer bonding performance of the second light emitting unit LE2 to the bonding pad 130, so as to reduce the falling-down or damage probability when the foldable display device 100 is in a folding state. In addition, the foldable display device 100 can further include a self-reflective layer 136. The self-reflective layer 136 can be disposed on the sidewall of the first light emitting units LE1 and/or on the sidewall of the second light emitting units LE2. The self-reflective layer 136 can prevent the light produced by the light emitting unit from emitting laterally, such that the light can vertically emit out the light emitting unit, thus avoiding occurrence of crosstalk and/or mixing of color lights. The disposition of the self-reflective layers 136 may be applied to other embodiments or variant embodiments of the present disclosure and will not be redundantly detailed.

Figure 5:
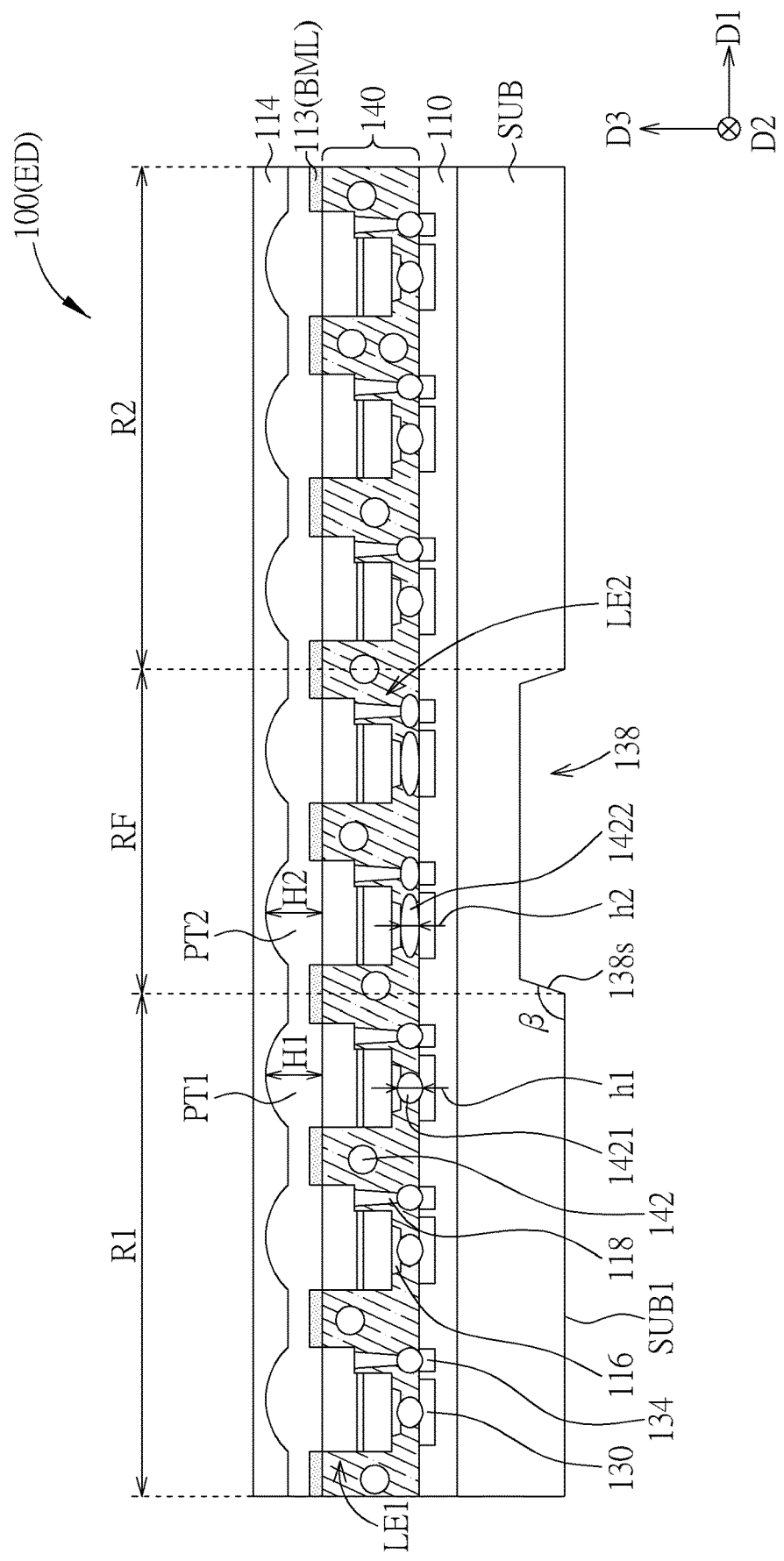
FIG. 5 is a schematic sectional-view of an electronic device or a foldable display device according to a third embodiment of the present disclosure.

Referring to FIG. 5, FIG. 5 is a schematic sectional-view of an electronic device or a foldable display device according to a third embodiment of the present disclosure. In the third embodiment, the first protector PT1 and the second protector PT2 may be a continuous layer extending laterally over the first light emitting units LE1 or the second light emitting units LE2 respectively. The first protector PT1 and the second protector PT2 may include the same or non-identical material. The first protector PT1 and the second protector PT2 may have apparent or unapparent boundary therebetween. In some embodiments, the second protector PT2 may comprise a material non-identical to the material of the first protector PT1, and the second protector PT2 may overlap with the foldable display region RF and some portions of the first display region R1 or the second display region R2 near the foldable display region RF. In the third embodiment, the sidewall 138s of the recess 138 in the flexible substrate SUB may be tilted with respect to the direction D3. For example, as shown in FIG. 5, the sidewall 138s and the bottom surface SUB1 of the flexible substrate SUB may have an included angle β that is an obtuse angle. In addition, in some embodiments, the bonding material for electrically connecting the first light emitting units LE1 and the second light emitting units LE2 to the circuit layer 110 may include an anisotropic conductive film (ACF) 140. As shown in FIG. 5, the ACF 140 is disposed between the first protector PT1, the second protector PT2, the first light emitting units LE1, the second light emitting units LE2, and the bonding pads 130, 134 of the circuit layer 110, which are disposed on the flexible substrate SUB. The ACF 140 may include a plurality of conductive particles 142. When bonding first light emitting units LE1 and the second light emitting units LE2 onto the circuit layer 110, the light emitting units are pressed downward to compress the conductive particles 142 therebelow, thus the compressed conductive particles 142 between the first electrodes 116 and the bonding pads 130 or between the second electrodes 118 and the bonding pads 134 can electrically connecting the corresponding light emitting unit to the circuit layer 110. In some embodiments, the pressing strength of the second light emitting units LE2 may be greater than the pressing strength of the first light emitting units LE1, and therefore the height h1 of one of the first conductive particles 1421 between one of the first light emitting units LE1 and the circuit layer 110 may be greater than the height h2 of one of the second conductive particles 1422 between the second light emitting units LE2 and the circuit layer 110. In some embodiments, for the same reason, the projection area of the first conductive particle 1421 may be smaller than the projection area of the second conductive particle 1422. In some embodiments, the height h1 of the first conductive particle 1421 and the height h2 of the second conductive particle are different.

Furthermore, FIG. 5 illustrates a black matrix (BM) layer BML disposed between the first protector PT1 or the second protector PT2 and the circuit layer 110. The BM layer BML includes a shielding portion 113 between two adjacent light emitting units. The black matrix layer BML can decrease the amount of light emitted from one light emitting unit to progress to another light emitting unit. The disposition of the black matrix layer BM may be applied to other embodiments or variant embodiments of the present disclosure.

Figure 6:
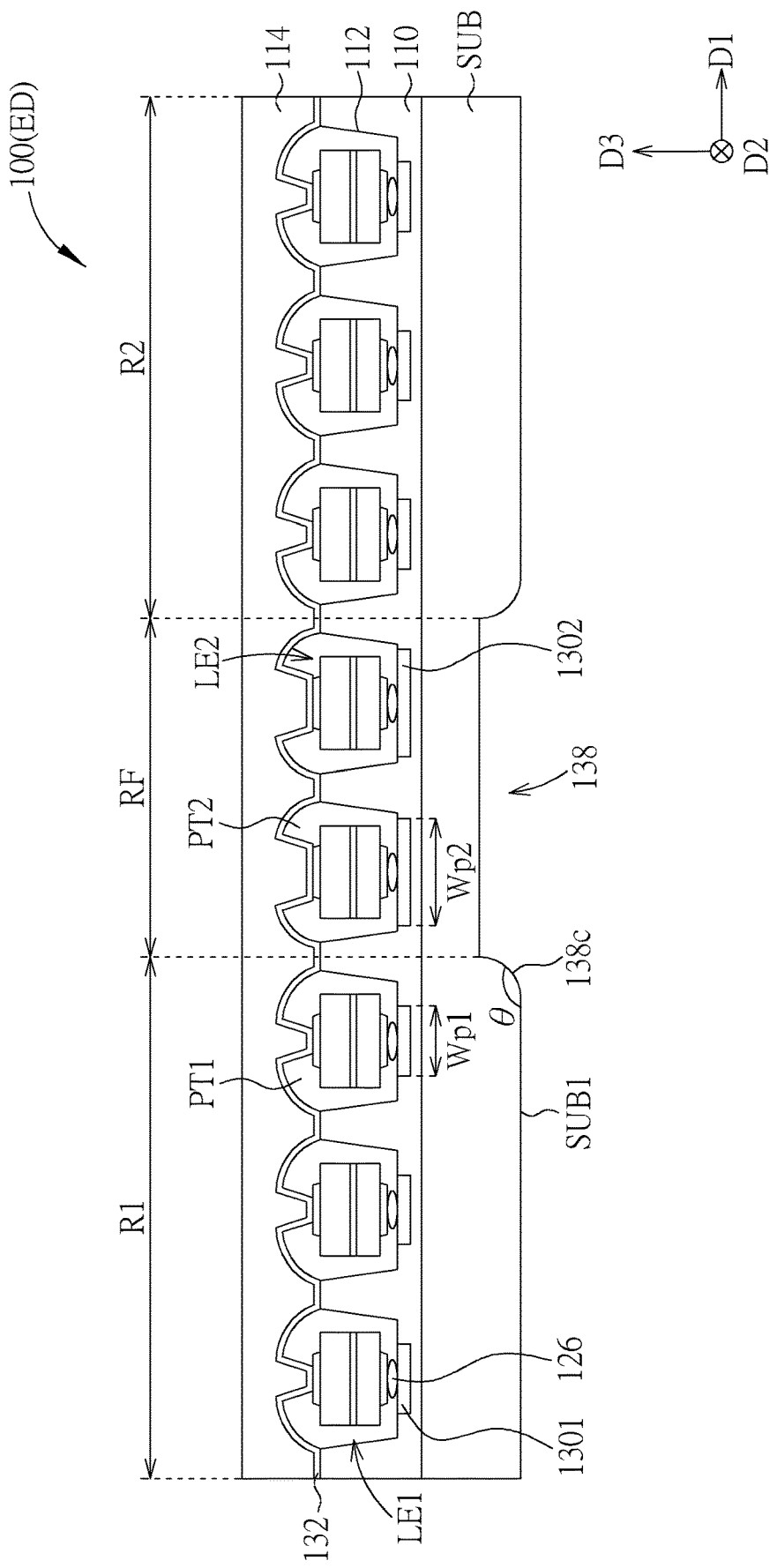
FIG. 6 is a schematic sectional-view of an electronic device or a foldable display device according to a fourth embodiment of the present disclosure.

FIG. 6 is a schematic sectional-view of an electronic device or a foldable display device according to a fourth embodiment of the present disclosure. In some embodiments, the circuit layer 110 includes a first bonding pad 1301 disposed in the first display region R1 and a second bonding pad 1302 disposed in the foldable display region RF. The first bonding pad 1301 corresponding to one of the first light emitting units LE1 may have an area Wp1 different from the area Wp2 of the second bonding pad 1302 corresponding to one of the second light emitting units LE2. In FIG. 6, the different widths of the first bonding pad 1301 and the second bonding pad 1302 may represent the different areas of the two bonding pads. For example, the area Wp2 may be larger than the area Wp1. The second bonding pad 1302 with a larger area in the foldable display region RF may improve the bonding effect or make the bonding stability more firmly, so as to reduce the chance of damage of the elements in the foldable display region RF when the foldable display region 100 is folded. In addition, the connection part 138c of the sidewall of the recess 138 of the flexible substrate SUB and the bottom surface SUB1 of the flexible substrate SUB may be curved in this embodiment, and the sidewall may have an included angle θ with the bottom surface SUB1 of the flexible substrate SUB. In some embodiments, the included angle θ may be an obtuse angle, but not limited thereto.

Figure 7:
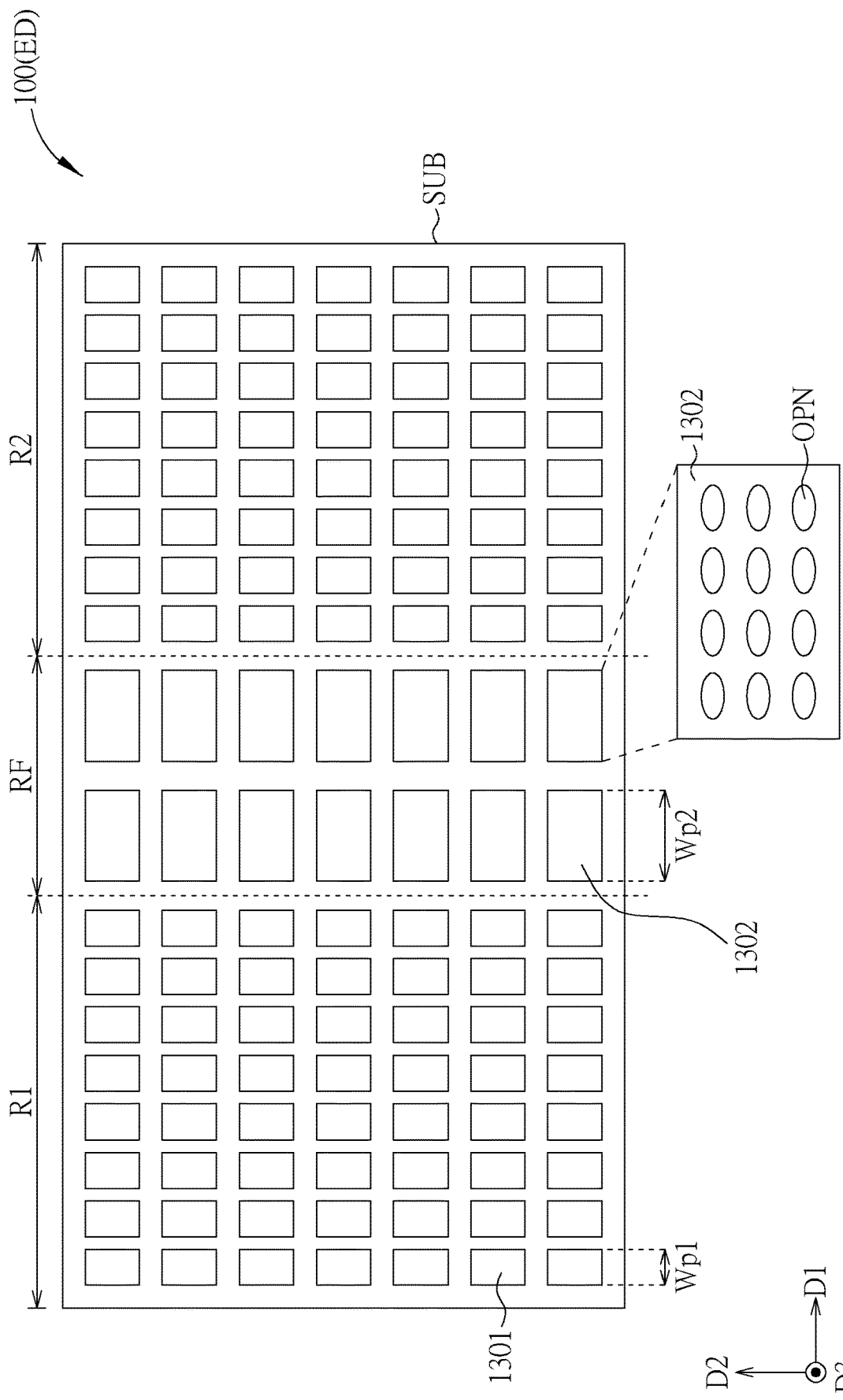
FIG. 7 is a schematic top-view of an electronic device or a foldable display device according to a variant embodiment of the fourth embodiment of the present disclosure.

FIG. 7 is a schematic top-view of an electronic device or a foldable display device according to a variant embodiment of the fourth embodiment of the present disclosure. In this variant embodiment, some or all of the second bonding pads 1302 in the foldable display region RF may have one or more openings OPN. The openings OPN may be arranged regularly or randomly in one of the second bonding pads 1302. The second bonding pads 1302 with the openings OPN may reduce the chance of cracking and help to release the stress accumulated in the second bonding pads 1302 when the foldable display device 100 is folded. The area of one single second bonding pad 1302 may be greater than the area of one single first bonding pad 1301, wherein the area of one single second bonding pad 1302 indicates that the occupied area or region of the second bonding pad 1302, including the occupied areas of the openings OPN or may be defined by the outer edges of the second bonding pad 1302. In some variant embodiments, the second bonding pads 1302 with the openings OPN in the foldable display region RF may have the same areas as that of the first bonding pads 1301 in the first display region R1 or the second display region R2. Similarly, the area of the second bonding pad 1302 includes the occupied area of the openings OPN.

Figure 8:
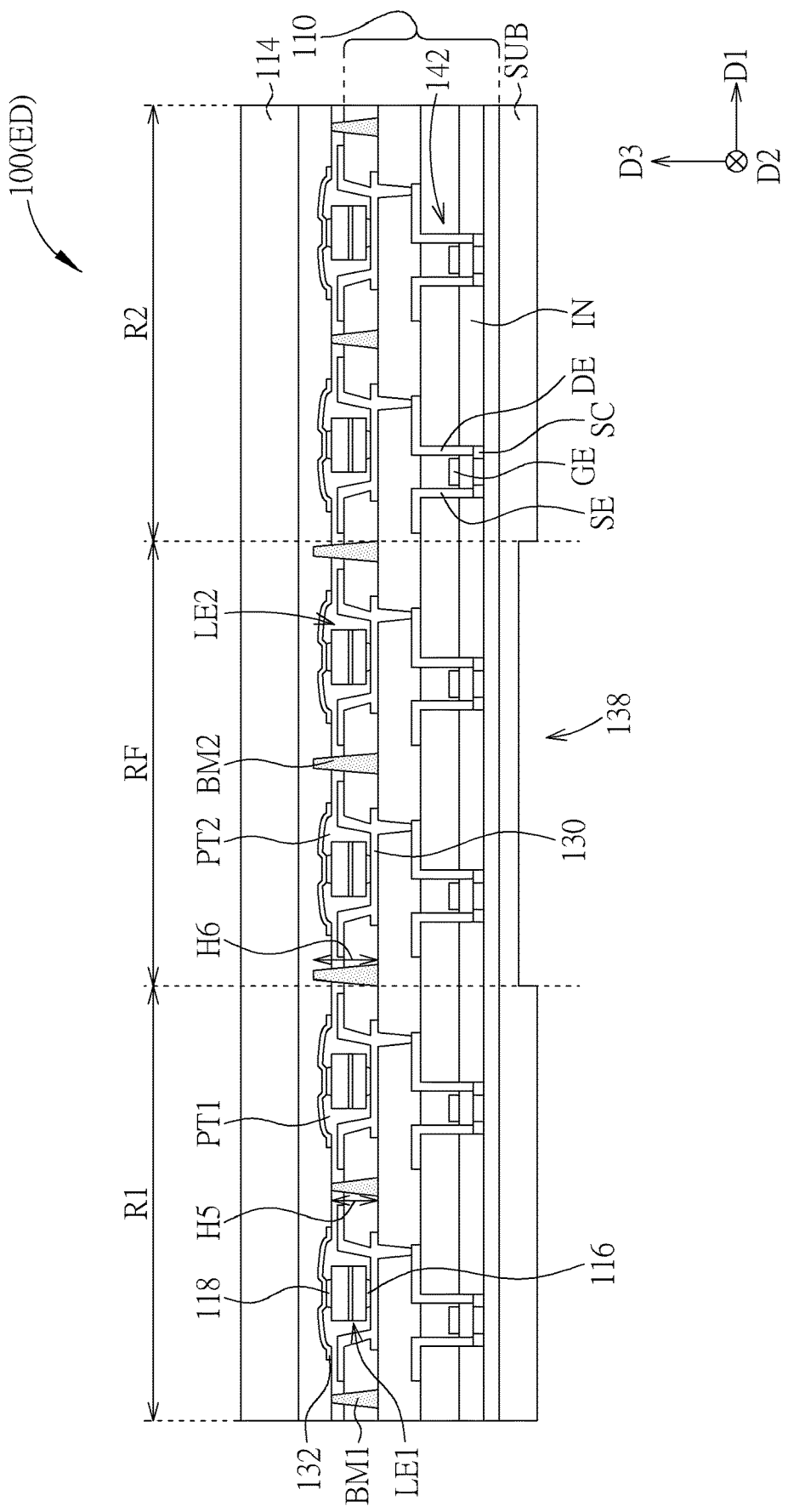
FIG. 8 is a schematic sectional-view of an electronic device or a foldable display device according to a fifth embodiment of the present disclosure.

FIG. 8 is a schematic sectional-view of an electronic device or a foldable display device according to a fifth embodiment of the present disclosure. In some embodiments, the foldable display device 100 may be an active-type display device, wherein the circuit layer 110 may include a plurality of driving elements, but not limited thereto. For example, the driving elements for driving the light emitting units may include thin film transistors (TFT) 142. One thin film transistor 142 may include a gate GE, a source SE, a drain DE, and a semiconductor layer SC, wherein the source SE and the drain DE are electrically connected to the semiconductor layer SC respectively and an insulating layer IN is positioned between the gate GE and the semiconductor layer SC. The source SE may be electrically connected to a signal line. The drain DE may be electrically connected to a bonding pad 130 or a connecting layer that is electrically connected to the corresponding first electrode 116 of the light emitting unit. Thus, the thin film transistor 142 can drive the corresponding light emitting unit. In this embodiment, the first light emitting units LE1 and the second light emitting units LE2 are vertical-type LEDs, their second electrodes 118 are electrically connected to a common electrode 132 respectively, and the adjacent common electrodes 132 may not connect to each other, but not limited thereto. As shown in FIG. 8, a plurality of first black matrix parts BM1 are disposed between two adjacent first light emitting units LE1 in the first display region R1 or the second display region R2, and a plurality of second black matrix parts BM2 are disposed between two adjacent second light emitting units LE2 in the foldable display region RF. A height H5 of the first black matrix parts BM1 can be less than a height H6 of the second black matrix parts BM2. The higher second black matrix parts BM2 may mitigate the cross talk issue resulted from the layer-shifting or element-shifting in the foldable display region RF when the foldable display device 100 is folded.

Figure 9:
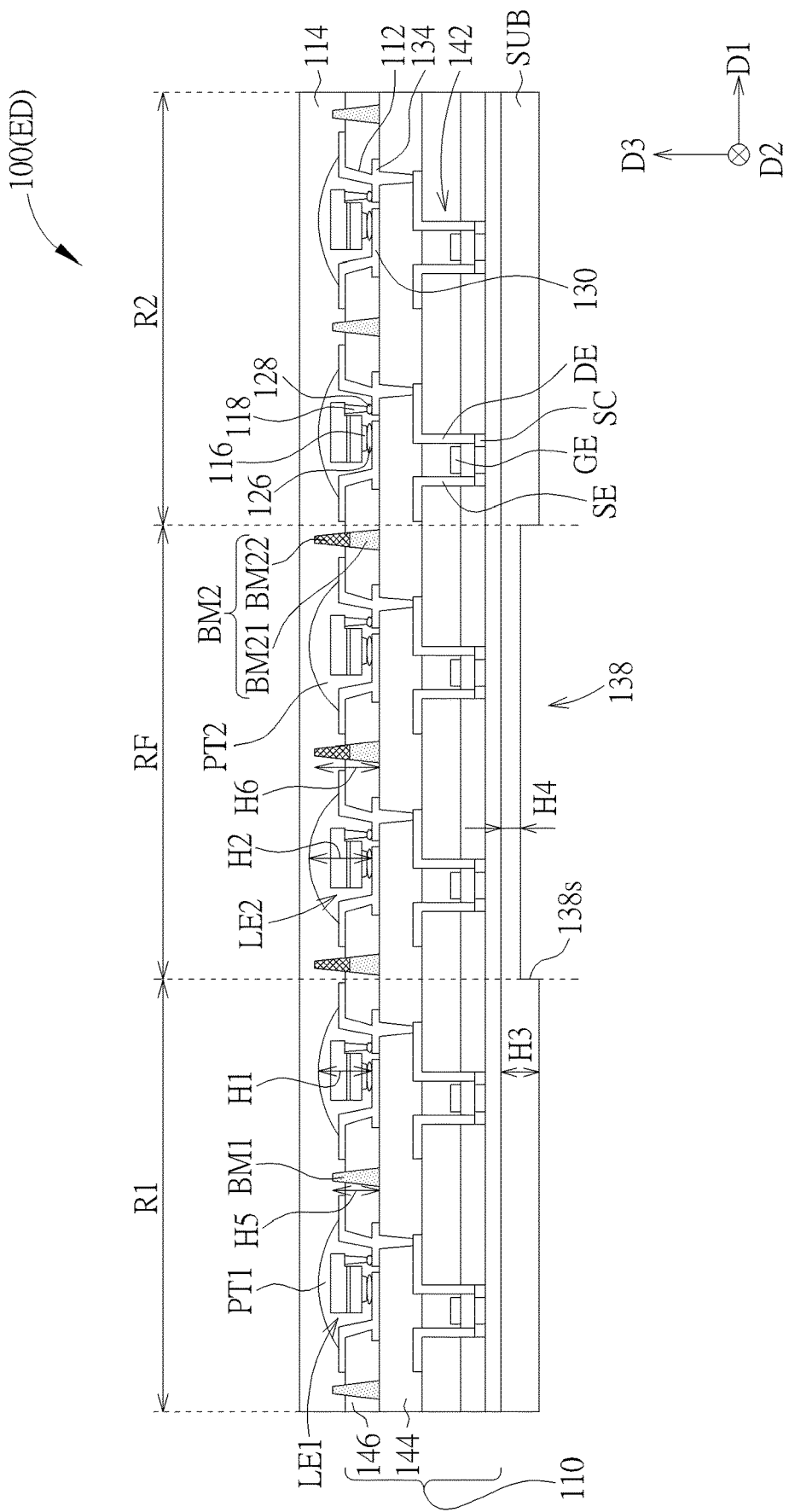
FIG. 9 is a schematic sectional-view of an electronic device or a foldable display device according to a sixth embodiment of the present disclosure.

FIG. 9 is a schematic sectional-view of an electronic device or a foldable display device according to a sixth embodiment of the present disclosure. In some embodiments, the foldable display device 100 may be an active-type display device, wherein the circuit layer 110 may include a plurality of driving elements, and the light emitting units may be flip-chip type LEDs, but not limited thereto. One light emitting unit may be driven by a driving element, which can be a thin film transistor 142. For example, the first electrode 116 of the light emitting unit is electrically connected to the bonding pad 130 of the circuit layer 110, the bonding pad 130 may be further electrically connected to a common source, and the drain DE of the thin film transistor 142 may be electrically connected to the second electrode 118 through the bonding pad 134. The thickness H2 of the second protector PT2 may be greater than the thickness H1 of the first protector PT1, and the thickness H4 of the flexible substrate SUB in the foldable display region RF may be less than the thickness H3 of the flexible substrate SUB in the first display region R1 or second display region R2, thus the second ratio Ra2 is greater than the first ratio Ra1. In addition, the second black matrix parts BM2 disposed between two adjacent second light emitting units LE2 in the foldable display region RF include a first black-matrix layer BM21 and a second black-matrix layer BM22 stacked on the first black-matrix layer BM21, and the first black-matrix layer BM21 and the second black-matrix layer BM22 can comprise non-identical materials. In some embodiments, the second black-matrix layer BM22 is composed of a material with lower density than the first black-matrix layer BM21, or the Young's modulus of the second black-matrix layer BM22 is less than that of the first black-matrix layer BM21. When the foldable display device 100 is folded, the upper layer of the second black matrix parts BM2 may suffer greater stress, thus the second black-matrix layer BM22 with lower density or less Young's modulus may decrease the damage probability of the second black matrix parts BM2. In some embodiments, the height H6 of the second black matrix parts BM2 may be greater than the height H5 of the first black matrix parts BM1 to mitigate light leakage between adjacent second light emitting units LE2 when the foldable display device 100 is folded. In some other embodiments, the height H6 may be substantially the same as the height H5.

Figure 10:
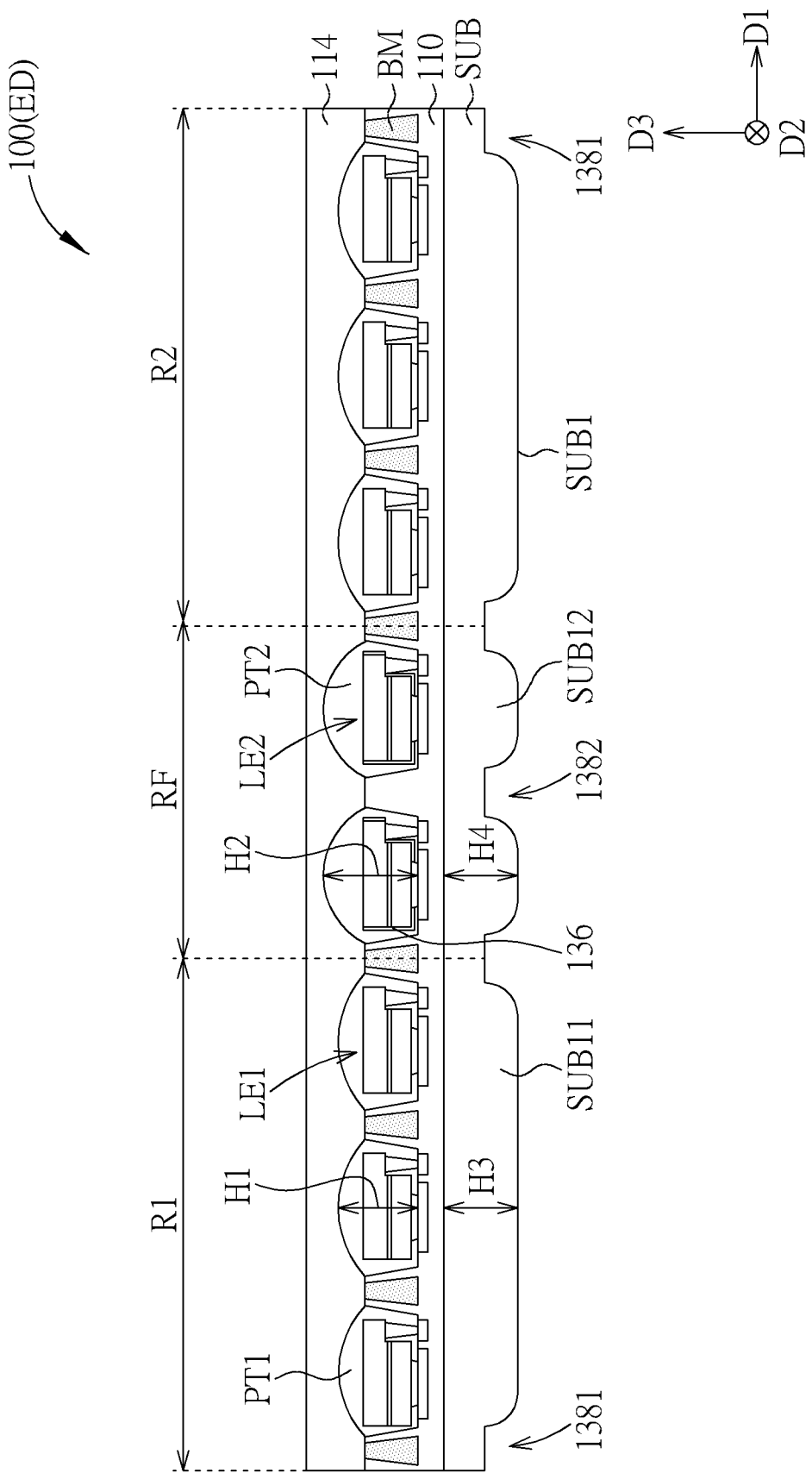
FIG. 10 is a schematic sectional-view of an electronic device or a foldable display device according to a seventh embodiment of the present disclosure.

FIG. 10 is a schematic sectional-view of an electronic device or a foldable display device according to a seventh embodiment of the present disclosure. In some embodiments, in order to mitigate light leakage, the black matrix parts BM are disposed between any two adjacent ones of the first light emitting units LE1 in the first display region R1 and the second display region R2. However, in the foldable display region RF, no black matrix parts are disposed between any two adjacent ones of the second light emitting units LE2. Self-reflective layers 136 can be disposed on sidewalls of the second light emitting units LE2 and some portions of bottom surfaces for mitigating light leakage. The self-reflective layers 136 replacing the black matrix parts BM in the foldable display region RF can improve the light shielding because light leakage resulted from layer-shift issue of the black matrix parts BM will not occur in the foldable display region RF.

As shown in FIG. 10, the bottom surface SUB1 of the flexible substrate SUB may have patterns with recesses 1381, 1382 and protrusions SUB11, SUB12. The recesses 1381, 1382 may include curved sidewalls respectively, but not limited thereto. The recesses 1381 in the first display region R1 and second display region R2 are disposed alternately with the first light emitting units LE1. In other words, the recesses 1381 do not overlap the first light emitting units LE1 in the direction D3 and are disposed between two adjacent first light emitting units LE1 in the direction D1. Similarly, the recesses 1382 in the foldable display region RF and the second light emitting units LE2 are disposed alternately. The recesses 1382 do not overlap the second light emitting units LE2 in the direction D3 and are disposed between any two adjacent second light emitting units LE2 in the direction D1. Since the recesses 1381, 1382 do not overlap the first light emitting units LE1 and the second light emitting units LE2, the flexible substrate SUB can provide good structural strength to the light emitting units for that the light emitting units are disposed on the part of the flexible substrate SUB with thicker thickness. In another aspect, the optical performance corresponding to each light emitting unit may be maintained. One protrusion SUB11 may correspond to two or more first light emitting units LE1, such as corresponding to three of the first light emitting units LE1 as a pixel. One protrusion SUB12 may correspond to one of the second light emitting units LE2, which may be considered as one sub-pixel. The recesses 1381 are disposed between any two adjacent protrusions SUB11 respectively, the recesses 1382 are disposed between any two adjacent protrusions SUB12, and therefore the arrangement density (the number of the recesses per area) of the recesses 1382 is greater than that of the recesses 1381. In some other embodiments, the arrangement density of the recesses 1382, 1381 may be substantially the same, wherein one protrusion SUB11 corresponds to one of the first light emitting units LE1 and one recess 1381 is positioned between any two adjacent first light emitting units LE1. As shown in FIG. 10, although the thickness H4 (largest thickness, or the thickness of the protrusion SUB12) of the flexible substrate SUB in the foldable display region RF may be the same as the thickness H3 (largest thickness, or the thickness of the protrusion SUB11) of the flexible substrate SUB in the first display region R1, the thickness H2 of the second protector PT2 can be greater than the thickness H1 of the first protector PT1, such that the second ratio Ra2 can be greater than the first ratio Ra1.

Figure 11:
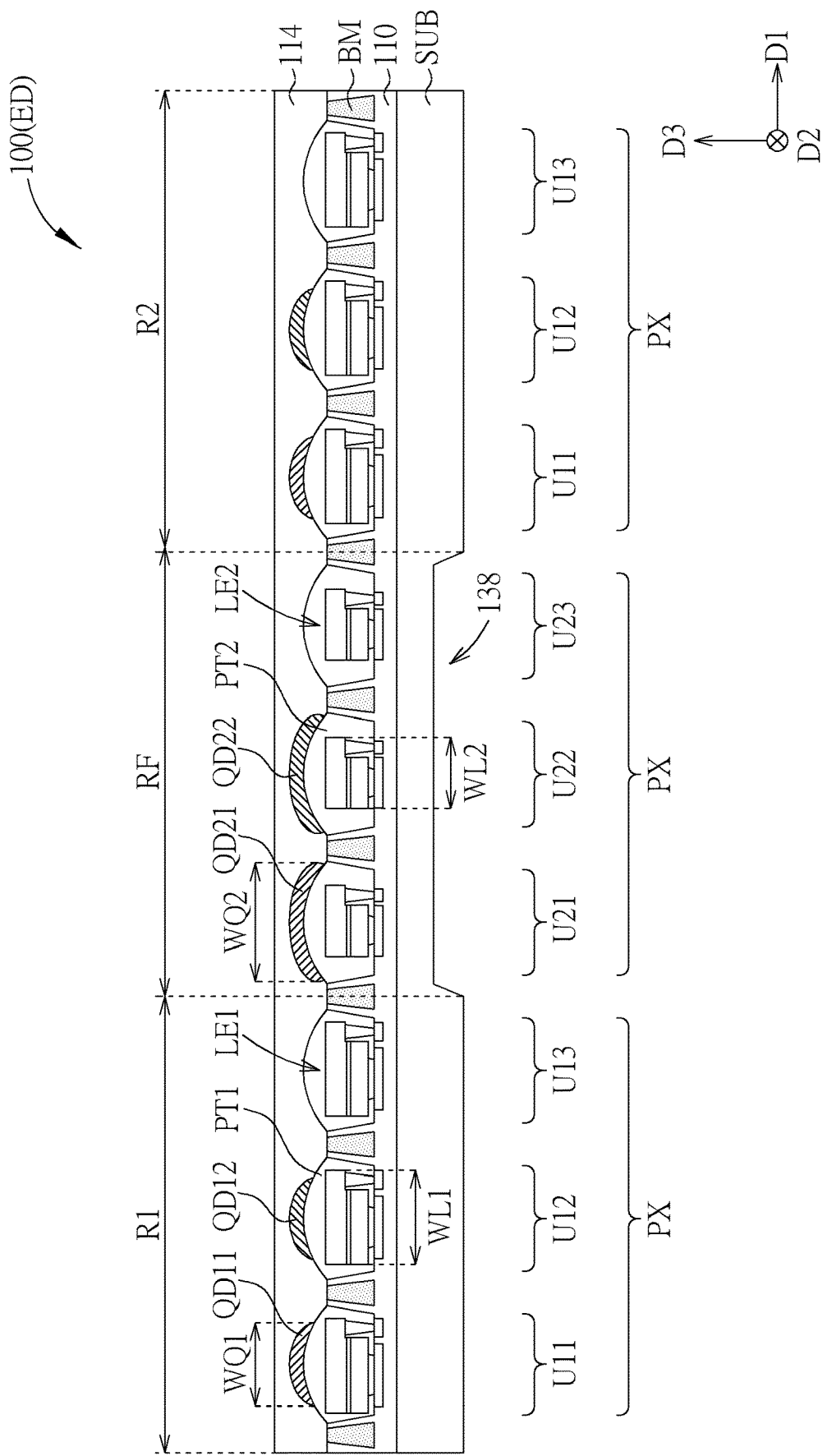
FIG. 11 is a schematic sectional-view of an electronic device or a foldable display device according to an eighth embodiment of the present disclosure.

FIG. 11 is a schematic sectional-view of an electronic device or a foldable display device according to an eighth embodiment of the present disclosure. In some embodiments, the first light emitting units LE1 have different areas or sizes from the second light emitting units LE2. As an example, the width WL1 of the first light emitting units LE1 in the direction D1 may be greater than the width WL2 of the second light emitting units LE2 in the same direction D1, which may indicate that the size or the area (or projection area) of the first light emitting units LE1 is greater than that of the second light emitting units LE2. As shown in FIG. 11, in some embodiments, the first light emitting units LE1 and the second light emitting units LE2 may be blue LEDs for example, a plurality of first light converters QD11, QD12 are disposed on at least a portion of the first light emitting units LE1, and a plurality of second light converters QD21, QD22 are disposed on at least a portion of the second light emitting units LE2. The first light converters QD11 and the second light converters QD21 can convert blue light into red light. The first light converters QD12 and the second light converters QD22 can convert blue light into green light. Accordingly, in the foldable display device 100, the sub-pixel unit U11 and U21 may represent a red sub-pixel that can produce red light, and the sub-pixel unit U12 and U22 may represent a green sub-pixel that can produce green light, and the sub-pixel unit U13 and U23 not covered by the light converter may represent a blue sub-pixel that can produce blue light. One sub-pixel U11, one sub-pixel U12, and one sub-pixel U13 may form a pixel PX in the first display region R1 or second display region R2. One sub-pixel U21, one sub-pixel U22, and one sub-pixel U23 may form a pixel PX in the foldable display region RF. In some embodiments, the first light converters QD11 or QD12 may have different areas WQ1 or sizes from the areas WQ2 of the second light converters QD21 or QD22. For example, the areas WQ2 (or widths) of the second light converters QD21 or QD22 may be greater than the areas WQ1 (or widths) of the first light converters QD11 or QD12. The larger covering area of the second light converters QD21 or QD22 with greater areas can mitigate the cross-talk issue or undesired light-mixing issue when the foldable display device 100 is folded. The first light converters QD11, QD12 and the second light converters QD21, QD22 may include quantum dot materials, but not limited thereto.

Figure 12:
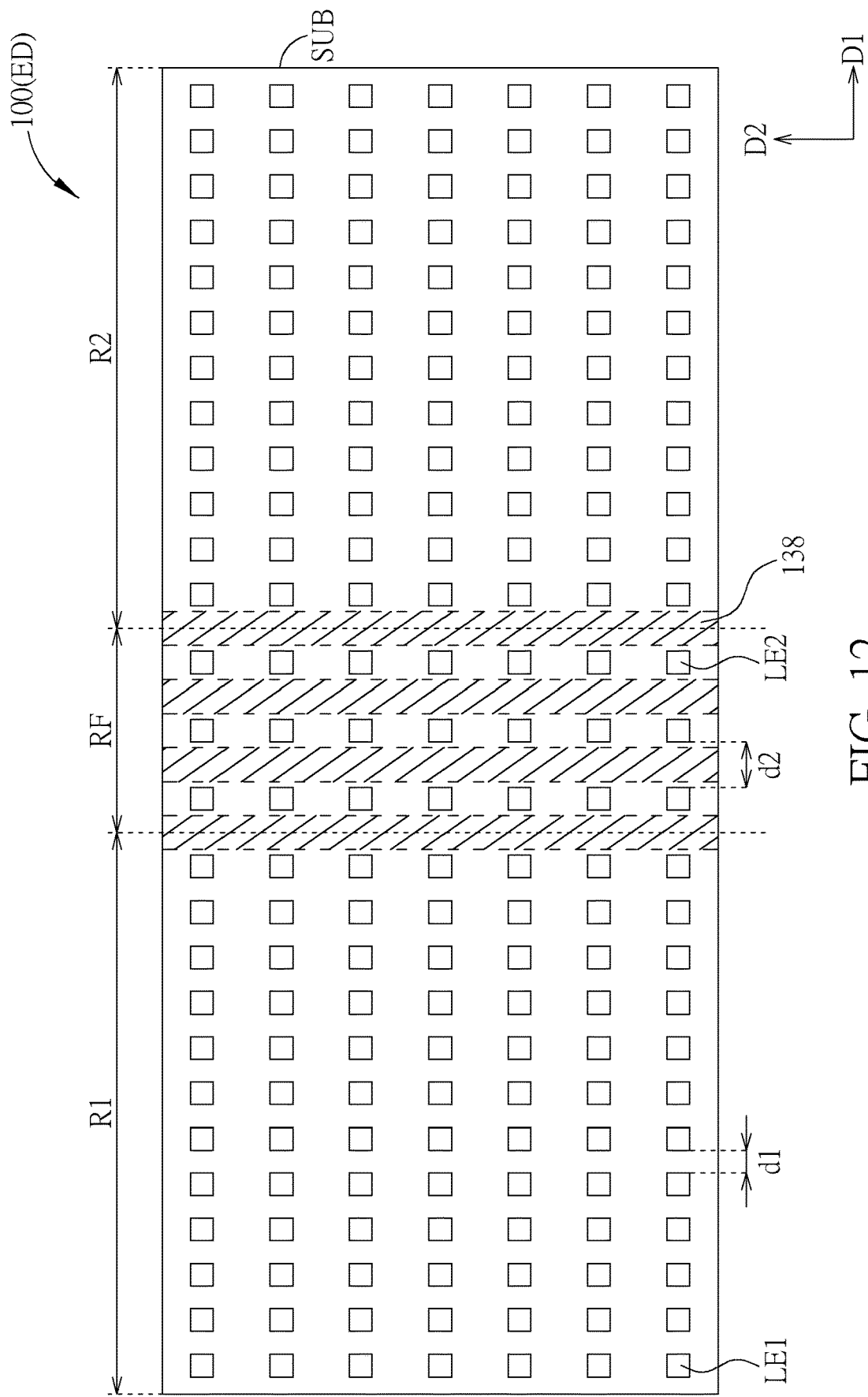
FIG. 12 is a schematic top-view of an electronic device or a foldable display device according to a ninth embodiment of the present disclosure.

FIG. 12 is a schematic top-view of an electronic device or a foldable display device according to a ninth embodiment of the present disclosure. Most of the layers and elements on the flexible substrate SUB are omitted for simplicity, and only the light emitting units and the recess 138 are shown in FIG. 12. In some embodiments, a distance d1 between two adjacent first light emitting units LE1 may be different from a distance d2 between two adjacent second light emitting units LE2. For example, the distance d1 may be less than the distance d2. Therefore, a number of the first light emitting units LE1 per inch in the first display region R1 or the second display region R2 may be greater than a number of the second light emitting units LE2 per inch in the foldable display region RF. In other words, the arrangement density of the first light emitting units LE1 in the first display region R1 or the second display region R2 may be greater than the arrangement density of the second light emitting units LE2 in the foldable display region RF. The less density of the second light emitting units LE2 may decrease the damage probability of the second light emitting units LE2 in the foldable display region RF.

Furthermore, as shown in FIG. 12, the flexible substrate SUB may include a plurality of recesses 138 at least located in the foldable display region RF. The recesses 138 (labeled as slant lines) may have strip shapes and extend along the direction D2 and positioned between two adjacent second light emitting units LE2. In some embodiments, a number of the first light emitting units LE1 per inch in the first display region R1 or the second display region R2 can be different from a number of the second light emitting units LE2 per inch in the foldable display region RF.

Figure 13:
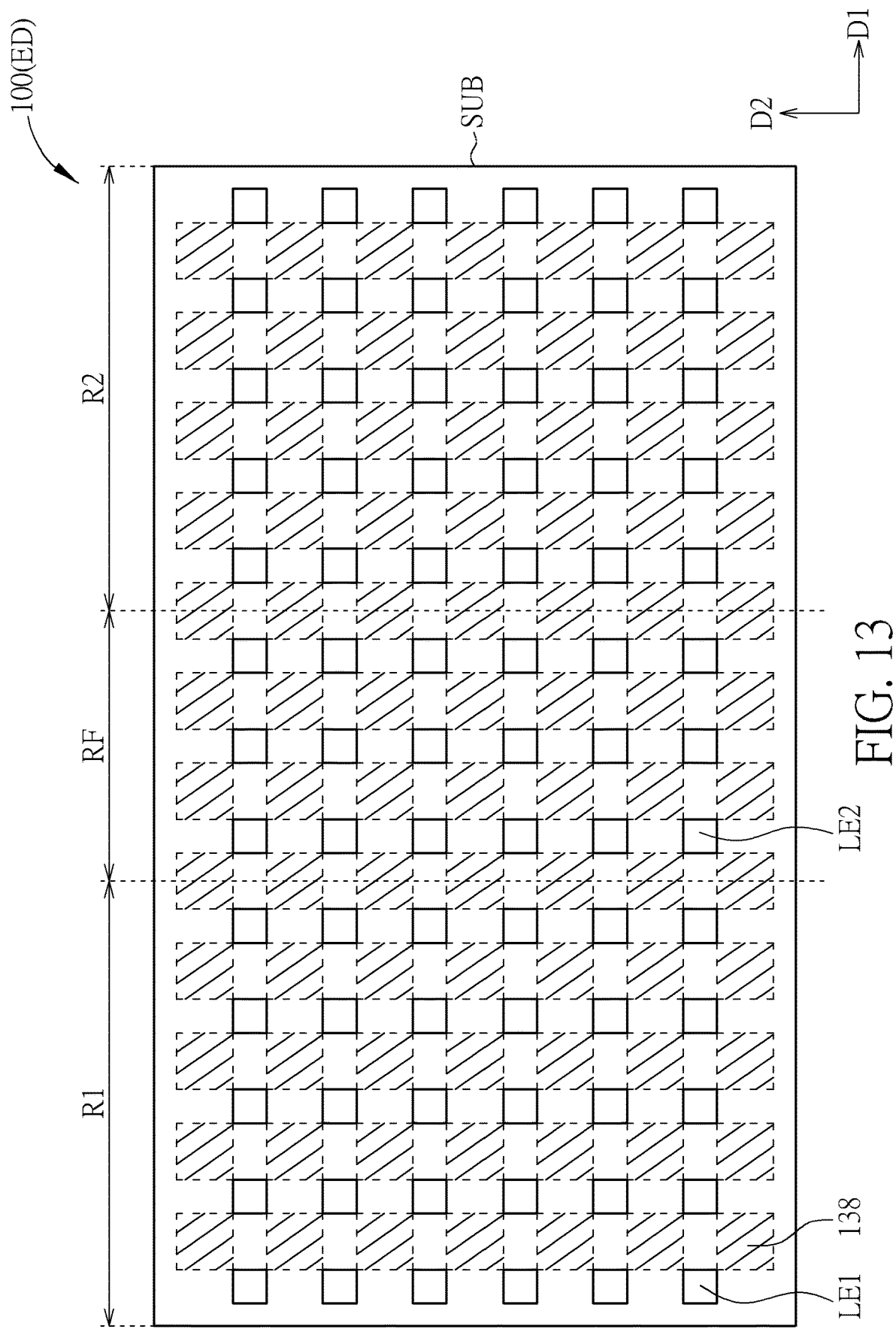
FIG. 13 is a schematic top-view of an electronic device or a foldable display device according to a tenth embodiment of the present disclosure.

FIG. 13 is a schematic top-view of an electronic device or a foldable display device according to a tenth embodiment of the present disclosure. As shown in FIG. 13, the recesses 138 of the flexible substrate SUB may be disposed in the first display region R1, the second display region R2, and the foldable display region RF, and the recesses 138 may have square-like shapes. The dispositions of the recesses 138 and the light emitting units can be staggered, i.e., one recess 138 may be disposed between two of adjacent first light emitting units LE1 or two of adjacent second light emitting units LE2. In FIG. 13, the distance between any two adjacent light emitting units may be approximately the same, but not limited thereto.

Figure 14:
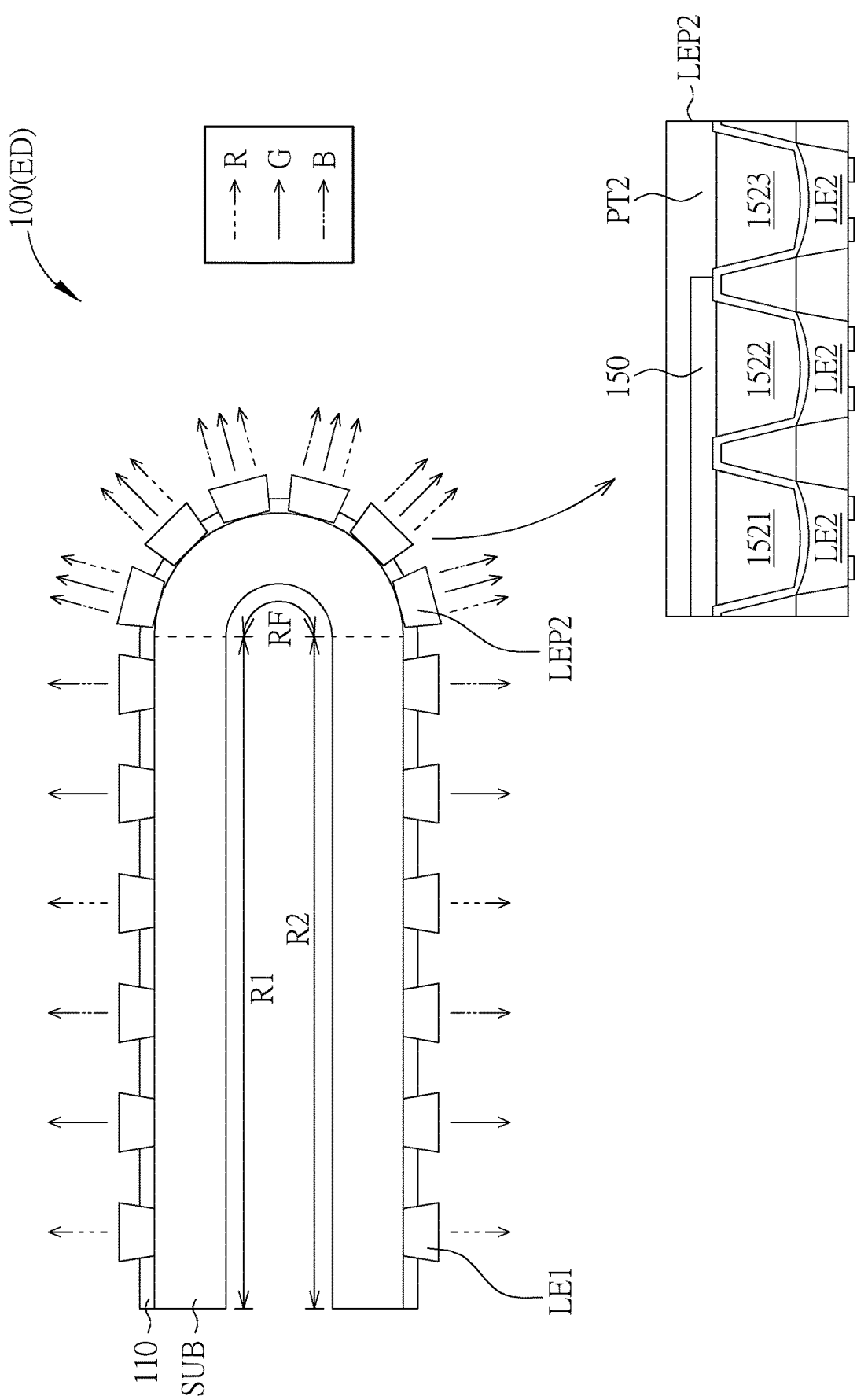
FIG. 14 is a schematic sectional-view of an electronic device or a foldable display device according to an eleventh embodiment of the present disclosure.

FIG. 14 is a schematic sectional-view of an electronic device or a foldable display device according to an eleventh embodiment of the present disclosure. As shown in FIG. 14, in the first display region R1 and second display region R2, a plurality of first light emitting units LE1 mentioned in the previous embodiments are disposed, thus one individual light-emitting unit LE1 may produce one kind of color light, such as red light, green light or blue light. In contrast, in the foldable display region RF, a plurality of light-emitting packages LEP2 are disposed. One light-emitting package LEP2 includes integrated LEDs. In detail, two or more than two of the second light emitting units LE2 can be integrated and packed as one light-emitting package LEP2. For example, three light emitting units can be integrated in one light emitting package LEP2. In detail, for example, three blue LEDs may be packaged in a light-emitting package LEP2, and a light converter 1521, a light converter 1522, and a filler 1523 may be disposed on one of the second light emitting units LE2 respectively. The light converter 1521 may convert blue light into red light, the light converter 1522 may convert blue light into green light, and the filler 1523 may be a transparent layer. A filter layer 150 may be optionally further disposed on the light converter 1521 and the light converter 1522 to filter out blue light. Accordingly, the second light emitting units LE2 in the light-emitting package LEP2 together with the light converter 1521, the light converter 1522, and the filler 1523 may produce red light, green light, and blue light, and the light-emitting package LEP2 can produce the light with a mixture of three kinds of color lights. This design can improve the light mixture in the foldable display region RF. In some other embodiments, the second light-emitting package LEP2 may package three kinds of LEDs that can produce different color lights respectively.

Figure 15:
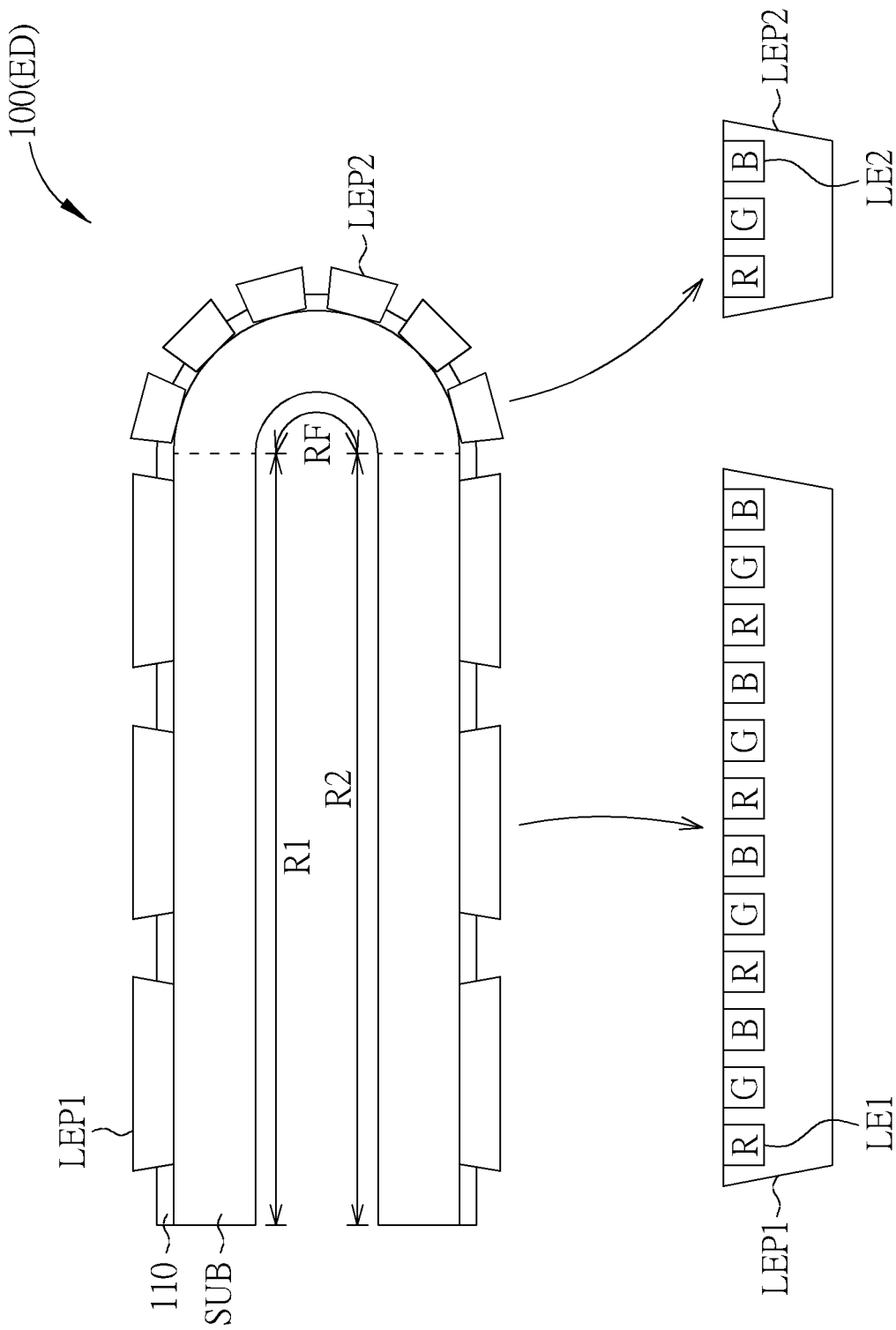
FIG. 15 is a schematic sectional-view of an electronic device or a foldable display device according to a twelfth embodiment of the present disclosure.

Referring to FIG. 15, FIG. 15 is a schematic sectional-view of an electronic device or a foldable display device according to a twelfth embodiment of the present disclosure. As shown in FIG. 15, integrated LEDs can also be used in the first display region R1 and the second display region R2. For example, a plurality of light-emitting packages LEP1 can be disposed in the first display region R1 and/or the second display region R2, and a plurality of light-emitting packages LEP2 can be disposed in the foldable display region RF. Two or more than two of the first light emitting units LE1 can be integrated in one light-emitting package LEP1, and two or more than two of the second light emitting units LE2 can be integrated in one light-emitting package LEP2. The number of the first light emitting units LE1 integrated in one of the light-emitting packages LEP1 may be different from, for example, greater than the number of the second light emitting units LE2 integrated in one of the light-emitting packages LEP2. In some embodiments, as shown in FIG. 15, the number of the first light emitting units LE1 integrated in one light emitting package LEP1 is 12, and the number of the second light emitting units LE2 integrated in one light-emitting package LEP2 is 3, but not limited thereto.

Figure 16:
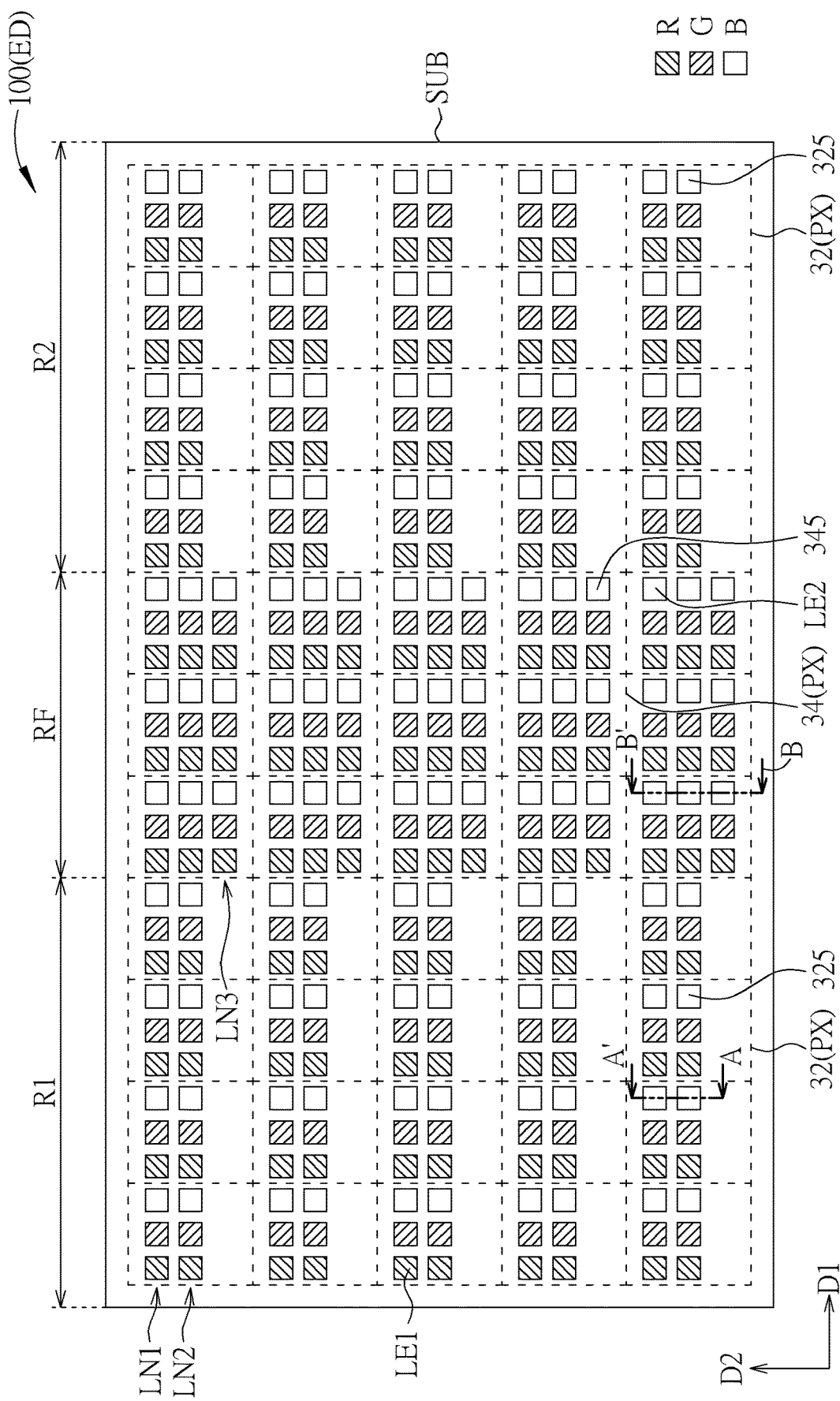
FIG. 16 is a schematic top-view of an electronic device or a foldable display device according to a thirteenth embodiment of the present disclosure.
Figure 17:
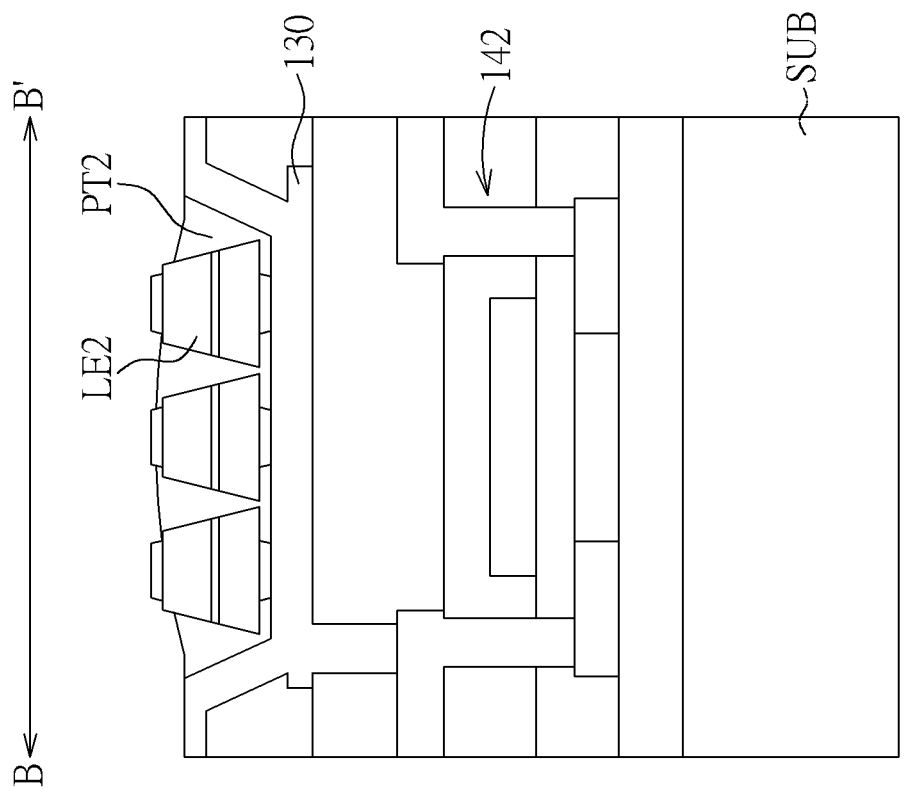
FIG. 17 shows enlarged schematic sectional-views of the light emitting units and circuit layer along the cross-line A-A' and the cross-line B-B' in FIG. 16.
Figure 17:
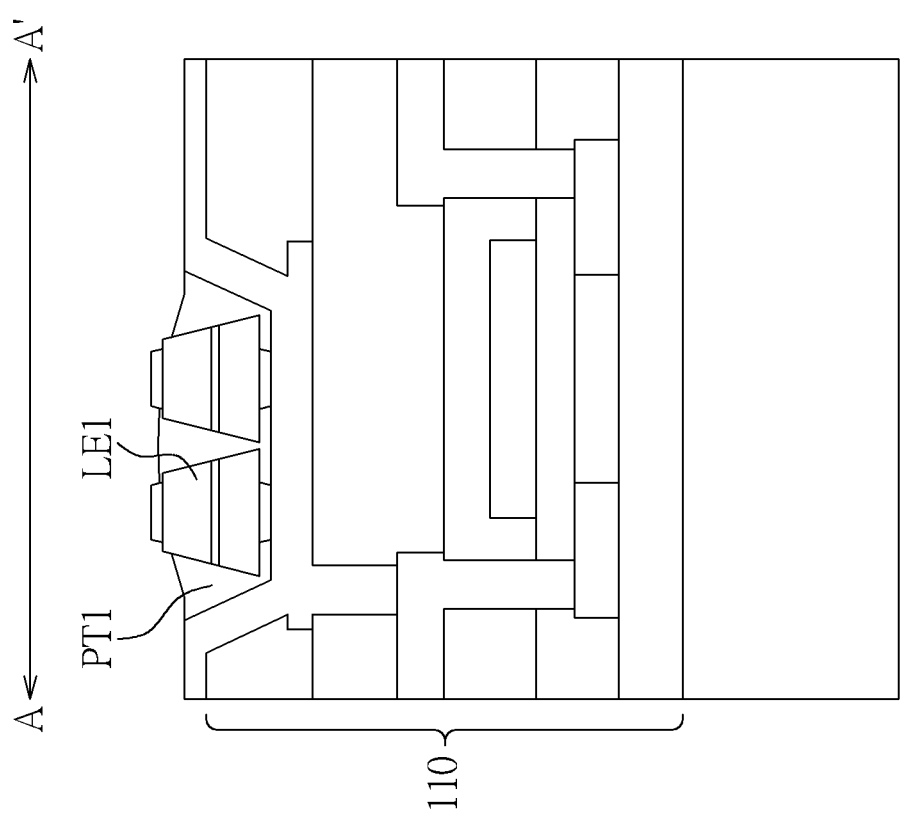

Referring to FIG. 16 and FIG. 17, FIG. 16 is a schematic top-view of an electronic device or a foldable display device according to a thirteenth embodiment of the present disclosure, and FIG. 17 shows enlarged schematic sectional-views of the light emitting units and circuit layer along the cross-line A-A' and the cross-line B-B' in FIG. 16. A plurality of pixels PX are defined on the flexible substrate SUB. As shown in FIG. 16, the first display region R1 includes a plurality of first pixel regions 32, the foldable display region RF includes a plurality of second pixel regions 34. As used herein, a pixel region is intended to mean a smallest repeating region that has display function. One pixel region can include primary color subpixels, for example, three primary color subpixels such as red, green and blue. In some embodiments, a group of light emitting diodes is repeated as one pixel region. Or, in some embodiments, a region in which an electrode (for example, an anode) or a group of electrodes is repeated can be regarded as one pixel region. In some further embodiments, a region in which a group of bonding pads (such as bonding pads 13) is repeated can be regarded as one pixel region. For example, each bonding pad in the group may correspond to a primary color light emitting diodes, but not limited thereto. According to some embodiments, in one pixel region, in addition to one set of basic RGB LEDs, at least one redundant set of RGB LEDs can be disposed. The redundant light emitting unit can be electrically connected to the corresponding basic light emitting unit. When the basic light emitting unit is faulty, the corresponding redundant light emitting unit can operate in place of the basic light emitting unit and emit light. Thus, according to some embodiment, redundant light emitting units can be disposed in some pixel regions. In detail, in one pixel region 32 of the first display region R1, two red LEDs, two green LEDs, and two blue LEDs may be disposed, and in one pixel region 34 of the foldable display region RF, three red LEDs, three green LEDs, and three blue LEDs may be disposed. In some embodiments, the light emitting units arranged in row LN1 along the direction D1 may serve as the basic light emitting units, and the light emitting units arranged in row LN2 or row LN3 along the direction D1 may serve as redundant light emitting units. Since the second light emitting units LE2 in the foldable display region RF may have greater chance of damage than the first light emitting units LE1, it can be designed that the number of the second light emitting units LE2 in one pixel region in the foldable display region RF can be greater than the number of the first light emitting units LE1 in one pixel region in the first display region R1. In detail, for example, in one first pixel region 32, a first portion 325 of the plurality of first light emitting units LE1 is disposed. In one second pixel region 34, a second portion 345 of the plurality of second light emitting units LE2 is disposed. The number of the first portion 325 of the first light emitting units LE1 (6 LEDs) is different from, for example, less than, the number of the second portion 345 (9 LEDs) of the second light emitting units LE2. In some other embodiments, the redundant first light emitting units LE1, redundant second light emitting units LE2 in row LN2 and row LN3 may not be bonded on the flexible substrate SUB before performing a test, and only redundant pads are disposed in row LN2 and row LN3. When a test, such a folding test, is performed and some defects occurs, the spare light emitting units can then be bonded on the corresponding bonding pads so as to replace the damaged light emitting units.

Figure 18:
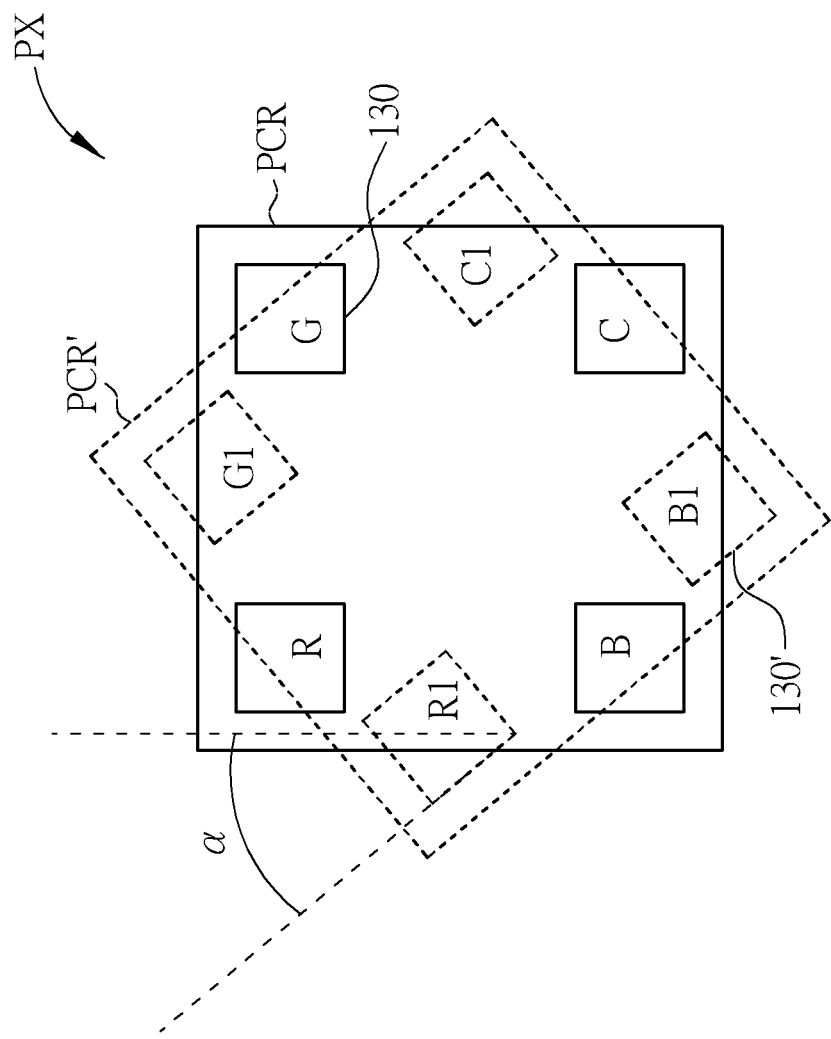
FIG. 18 shows an enlarged schematic top-view of one pixel of the foldable display device according to a fourteenth embodiment of the present disclosure.

FIG. 18 shows an enlarged schematic top-view of one pixel of the foldable display device according to a fourteenth embodiment of the present disclosure. In some embodiments, one pixel PX may have a predetermined bonding region PCR for bonding light emitting units, wherein the predetermined bonding region PCR may include bonding pads 130 for electrically connecting to the red LED, green LED, blue LED, and the common electrode of the light emitting units, which are represented as "R", "G", "B", "C" in FIG. 18 respectively. In addition, a redundant bonding region PCR' may be optionally disposed, and the redundant bonding region PCR' can also include redundant bonding pads 130', which are represented as "R1", "G1", "B1", "C1". The redundant bonding region PCR' may be rotated with an angle α from the predetermined bonding region PCR, and the redundant bonding pads 130' do not overlap the bonding pads 130. If a damage occurs, the originally bonded light emitting unit can be removed from the predetermined bonding region PCR, and a new light emitting unit can be bonded on the redundant bonding region PCR'.

Figure 19:
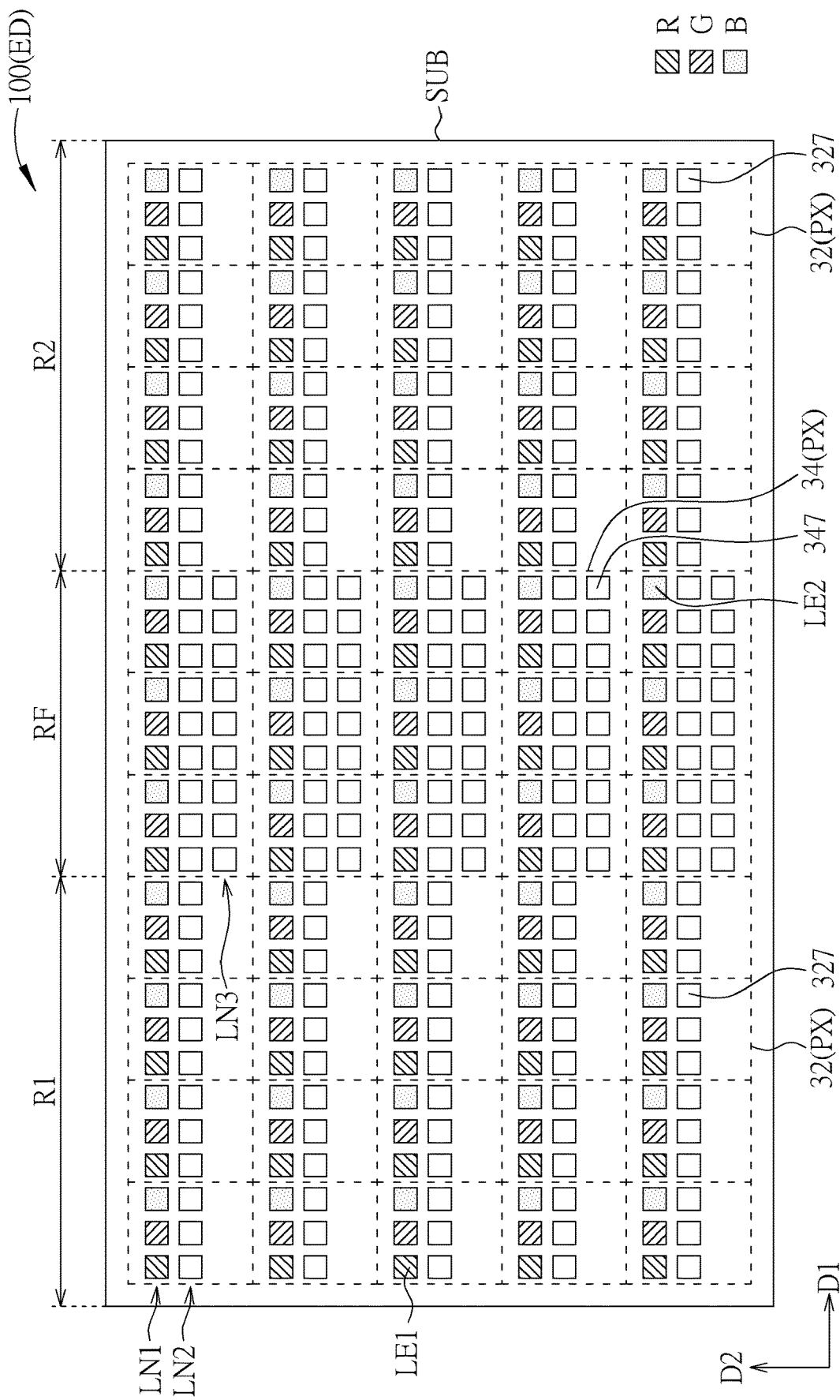
FIG. 19 is a schematic top-view of an electronic device or a foldable display device according to a fifteenth embodiment of the present disclosure.

FIG. 19 is a schematic top-view of an electronic device or a foldable display device according to a fifteenth embodiment of the present disclosure. The first display region R1 includes a plurality of first pixel regions 32, and the foldable display region RF includes a plurality of second pixel regions 34. According to some embodiments, in one pixel region, in addition to one set of basic bonding pads, at least one redundant set of bonding pads can be disposed. If a damage occurs, the originally bonded light emitting unit will be removed, and the same or different light emitting unit can be bonded to the redundant bonding pad. Thus, according to some embodiments, redundant bonding pads can be disposed in some pixel regions. In detail, the number of the first bonding pads 327 in one pixel region 32 of the first display region R1 can be different from, for example, less than, the number of the second bonding pads 347 in one pixel region 34 of the foldable display region RF. In some embodiments, the bonding pads arranged in row LN1 along the direction D1 may serve as the basic bonding pads, and the bonding pads arranged in row LN2 or row LN3 along the direction D1 may serve as redundant bonding pads. FIG. 19 shows that the light emitting units are bonded to the basic bonding pads arranged in row LN1, but not limited thereto.

According to the present disclosure, in the foldable display device, the first ratio of the thickness of the first protector to the thickness of the flexible substrate in the first display region is less than the second ratio of the thickness of the second protector to the thickness of the flexible substrate in the foldable display region. Therefore, the reliability of the bonding of the second light emitting units in the foldable display region may be improved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A foldable display device including a first display region, a second display region, and a foldable display region connecting the first display region and the second display region, the foldable display device comprising:
 a flexible substrate;
 a plurality of first light emitting units disposed on the flexible substrate in the first display region;
 a plurality of second light emitting units disposed on the flexible substrate in the foldable display region;
 a first protector protecting at least one of the first light emitting units; and
 a second protector protecting at least one of the second light emitting units;
 wherein a ratio of a thickness of the first protector to a thickness of the flexible substrate in the first display region is defined as a first ratio, a ratio of a thickness of the second protector to a thickness of the flexible substrate in the foldable display region is defined as a second ratio, and the second ratio is greater than the first ratio, and the thickness of the second protector is greater than the thickness of the first protector.

2. The foldable display device as claimed in claim 1, wherein a difference between the first ratio and the second ratio is in a range from 0.005 to 1.5.

3. The foldable display device as claimed in claim 1, wherein a Young's Modulus of the second protector is less than a Young's Modulus of the first protector.

4. The foldable display device as claimed in claim 1, wherein a thickness of the flexible substrate in the first display region is greater than a thickness of the flexible substrate in the foldable display region.

5. The foldable display device as claimed in claim 1, further comprising a circuit layer, wherein one of the plurality of first light emitting units is electrically connected to the circuit layer by a first bonding material, one of the plurality of second light emitting units is electrically connected to the circuit layer by a second bonding material, and the first bonding material and the second bonding material have different areas.

6. The foldable display device as claimed in claim 1, further comprising a circuit layer, wherein one of the plurality of first light emitting units is electrically connected to the circuit layer by a first conductive particle, one of the plurality of second light emitting units is electrically connected to the circuit layer by a second conductive particle, and the first conductive particle and the second conductive particle have different heights.

7. The foldable display device as claimed in claim 1, further comprising a circuit layer, wherein the circuit layer includes a first bonding pad disposed in the first display region, and a second bonding pad disposed in the foldable display region, and wherein one of the plurality of first light emitting units is electrically connected to the circuit layer through the first bonding pad, one of the plurality of second light emitting units is electrically connected to the circuit layer through the second bonding pad, and a width of the first bonding pad is different from a width of the second bonding pad.

8. The foldable display device as claimed in claim 7, further comprising a circuit layer, wherein the circuit layer includes a second bonding pad disposed in the foldable display region, and wherein one of the plurality of second light emitting units is electrically connected to the circuit layer through the second bonding pad, and the second bonding pad has a plurality of openings.

9. The foldable display device as claimed in claim 1, wherein one of the plurality of first light emitting units and one of the plurality of second light emitting units have different areas.

10. The foldable display device as claimed in claim 1, wherein a number of the plurality of first light emitting units per inch in the first display region is greater than a number of the plurality of second light emitting units per inch in the foldable display region.

11. The foldable display device as claimed in claim 1, wherein a distance between two adjacent first light emitting units of the plurality of first light emitting units is different from a distance between two adjacent second light emitting units of the plurality of second light emitting units.

12. The foldable display device as claimed in claim 1, further comprising a plurality of first black matrix parts disposed between two adjacent first light emitting units of the plurality of first light emitting units; and a plurality of second black matrix parts disposed between two adjacent second light emitting units of the plurality of second light emitting units, wherein a height of one of the plurality of the first black matrix parts is less than a height of one of the plurality of the second black matrix parts.

13. The foldable display device as claimed in claim 1, further comprising a plurality of first black matrix parts disposed between two adjacent first light emitting units of the plurality of first light emitting units; and a plurality of second black matrix parts disposed between two adjacent second light emitting units of the plurality of second light emitting units, wherein one of the second black matrix parts has a first black-matrix layer and a second black-matrix layer stacked on the first black-matrix layer, and the first black-matrix layer and the second black-matrix layer comprise non-identical materials.

14. The foldable display device as claimed in claim 13, wherein a Young's modulus of the first black-matrix layer is greater than a Young's modulus of the second black-matrix layer.

15. The foldable display device as claimed in claim 1, further comprising a self-reflective layer disposed on a sidewall of one of the plurality of second light emitting units.

16. The foldable display device as claimed in claim 1, further comprising a plurality of first light converters disposed on at least a portion of the first light emitting units; and a plurality of second light converters disposed on at least a portion of the second light emitting units, wherein an area of one of the plurality of first light converters is different from an area of one of the plurality of second light converters.

17. The foldable display device as claimed in claim 1, wherein the first display region includes a first pixel region, the foldable display region includes a second pixel region, a first portion of the plurality of first light emitting units is disposed in the first pixel region, and a second portion of the plurality of second light emitting units is disposed in the second pixel region, and wherein a number of the first portion of the plurality of first light emitting units is different from a number of the second portion of the plurality of second light emitting units.

18. The foldable display device as claimed in claim 1, wherein the first display region includes a first pixel region, the foldable display region includes a second pixel region, and the circuit layer includes a plurality of first bonding pads in the first pixel region and a plurality of second bonding pads in the second pixel region, and wherein a number of the plurality of first bonding pads is different from a number of the plurality of second bonding pads.

19. A foldable electronic device including a first region a second region, and a foldable region connecting the first region and the second region, the foldable electronic device comprising:
   a flexible substrate;
   a plurality of first electronic units disposed on the flexible substrate in the first region;
   a plurality of second electronic units disposed on the flexible substrate in the foldable region;
   a first protector protecting at least one of the first electronic units; and
   a second protector protecting at least one of the second electronic units;
   wherein a ratio of a thickness of the first protector to a thickness of the flexible substrate in the first region is defined as a first ratio, a ratio of a thickness of the second protector to a thickness of the flexible substrate in the foldable region is defined as a second ratio, the second ratio is greater than the first ratio, and the thickness of the second protector is greater than the thickness of the first protector.

20. A foldable display device including a first display region, a second display region, and a foldable display region connecting the first display region and the second display region, the foldable display device comprising:
- a flexible substrate;
- a plurality of first light emitting units disposed on the flexible substrate in the first display region;
- a plurality of second light emitting units disposed on the flexible substrate in the foldable display region;
- a first protector protecting at least one of the first light emitting units; and
- a second protector protecting at least one of the second light emitting units;
- wherein a ratio of a thickness of the first protector to a thickness of the flexible substrate in the first display region is defined as a first ratio, a ratio of a thickness of the second protector to a thickness of the flexible substrate in the foldable display region is defined as a second ratio, the second ratio is greater than the first ratio, and a Young's Modulus of the second protector is less than a Young's Modulus of the first protector.

* * * * *